US012581688B2

(12) United States Patent
Shiokawa et al.

(10) Patent No.: US 12,581,688 B2
(45) Date of Patent: Mar. 17, 2026

(54) SEMICONDUCTOR DEVICE, SEMICONDUCTOR MEMORY DEVICE, AND SEMICONDUCTOR DEVICE MANUFACTURING METHOD

(71) Applicant: Kioxia Corporation, Tokyo (JP)

(72) Inventors: Taro Shiokawa, Nagoya Aichi (JP);
Kiwamu Sakuma, Yokkaichi Mie (JP);
Keiko Sakuma, Yokkaichi Mie (JP);
Mutsumi Okajima, Yokkaichi Mie
(JP); Kazuhiro Matsuo, Kuwana Mie
(JP); Masaya Toda, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 671 days.

(21) Appl. No.: 17/842,457

(22) Filed: Jun. 16, 2022

(65) Prior Publication Data

US 2023/0197857 A1      Jun. 22, 2023

(30) Foreign Application Priority Data

Dec. 17, 2021      (JP) ................................. 2021-205071

(51) Int. Cl.
| | |
|---|---|
| *H10D 30/67* | (2025.01) |
| *H10B 12/00* | (2023.01) |
| *H10D 99/00* | (2025.01) |

(52) U.S. Cl.
CPC ......... *H10D 30/6728* (2025.01); *H10B 12/05* (2023.02); *H10B 12/33* (2023.02); *H10D 30/6755* (2025.01); *H10D 99/00* (2025.01)

(58) Field of Classification Search
CPC ........... H10D 30/6728; H10D 30/6755; H10D 30/6757
See application file for complete search history.

(56) References Cited

U.S. PATENT DOCUMENTS

| | | | | |
|---|---|---|---|---|
| 5,308,782 A | * | 5/1994 | Mazure | H10D 30/0321 |
| | | | | 257/E29.267 |
| 5,554,870 A | * | 9/1996 | Fitch | H10D 30/63 |
| | | | | 257/334 |

(Continued)

FOREIGN PATENT DOCUMENTS

| | | | | |
|---|---|---|---|---|
| CN | 111710724 A | * | 9/2020 | ....... H01L 21/02554 |
| JP | 2015109426 A | * | 6/2015 | |
| JP | 2019-169490 A | | 10/2019 | |

OTHER PUBLICATIONS

Samson, Leroy; Material removal: etching processes, https://www.slideserve.com/leroy/material-removal-etching-processes; Jul. 10, 2014; https://www.slideserve.com/leroy/material-removal-etching-processes (Year: 2014).*

*Primary Examiner* — Vincent Wall
(74) *Attorney, Agent, or Firm* — Foley & Lardner LLP

(57) ABSTRACT
A semiconductor device of embodiments includes: a first electrode; a second electrode; an oxide semiconductor layer between the first electrode and the second electrode and including a first region surrounded by the first electrode in a plane perpendicular to a first direction from the first electrode toward the second electrode; a gate electrode facing the oxide semiconductor layer; a gate insulating layer; a first insulating layer between the gate electrode and the first electrode; and a second insulating layer between the gate electrode and the second electrode. A first maximum distance between a first portion of the first electrode and a second portion of the first electrode in a second direction in a cross section parallel to the first direction is larger than a minimum distance between a third portion of the first insulating layer and a fourth portion of the first insulating layer in the second direction.

20 Claims, 26 Drawing Sheets

(56)　　　　　　　References Cited

U.S. PATENT DOCUMENTS

| | | | | |
|---|---|---|---|---|
| 9,698,272 | B1 * | 7/2017 | Ikeda ................... | H10D 86/481 |
| 10,665,694 | B2 * | 5/2020 | Cheng ................... | H10B 63/34 |
| 10,714,629 | B2 * | 7/2020 | Saito ................. | H10D 30/6728 |
| 10,790,396 | B2 | 9/2020 | Sawabe et al. | |
| 11,871,557 | B2 * | 1/2024 | Shiokawa .......... | H10D 30/6755 |
| 2014/0091360 | A1 * | 4/2014 | Pillarisetty ............ | H10D 30/62 |
| | | | | 257/190 |
| 2015/0069320 | A1 * | 3/2015 | Rabkin ............. | G11C 13/0033 |
| | | | | 438/156 |
| 2017/0077230 | A1 * | 3/2017 | Ikeda ..................... | H10B 43/50 |
| 2019/0214559 | A1 * | 7/2019 | Clarke ................. | H10B 63/30 |
| 2019/0237581 | A1 * | 8/2019 | Saito ................... | H10D 30/031 |
| 2019/0296155 | A1 * | 9/2019 | Sawabe ................. | H10B 12/31 |
| 2020/0111917 | A1 * | 4/2020 | Ramaswamy ......... | H10D 99/00 |
| 2020/0303554 | A1 * | 9/2020 | Sawabe ................. | H10B 63/34 |
| 2021/0305431 | A1 * | 9/2021 | Ishimaru ............ | H10D 30/6755 |
| 2022/0085212 | A1 * | 3/2022 | Sato ....................... | H10D 62/80 |
| 2022/0285350 | A1 * | 9/2022 | Okajima ............ | H10D 30/6755 |
| 2023/0197857 | A1 * | 6/2023 | Shiokawa .............. | H10B 12/33 |
| | | | | 257/43 |
| 2024/0315043 | A1 * | 9/2024 | Fujii ...................... | H10B 51/10 |

* cited by examiner

AA' CROSS SECTION

SECOND DIRECTION

SEMICONDUCTOR DEVICE, SEMICONDUCTOR MEMORY DEVICE, AND SEMICONDUCTOR DEVICE MANUFACTURING METHOD

CROSS-REFERENCE TO RELATED APPLICATION

This application is based upon and claims the benefit of priority from Japanese Patent Application No. 2021-205071, filed on Dec. 17, 2021, the entire contents of which are incorporated herein by reference.

FIELD

Embodiments described herein relate generally to a semiconductor device, a semiconductor memory device, a semiconductor device manufacturing method.

BACKGROUND

An oxide semiconductor transistor in which a channel is formed in an oxide semiconductor layer has an excellent characteristic that the channel leakage current during off operation is very small. For this reason, for example, the oxide semiconductor transistor can be applied as a switching transistor of a memory cell of a dynamic random access memory (DRAM).

Figure 1:
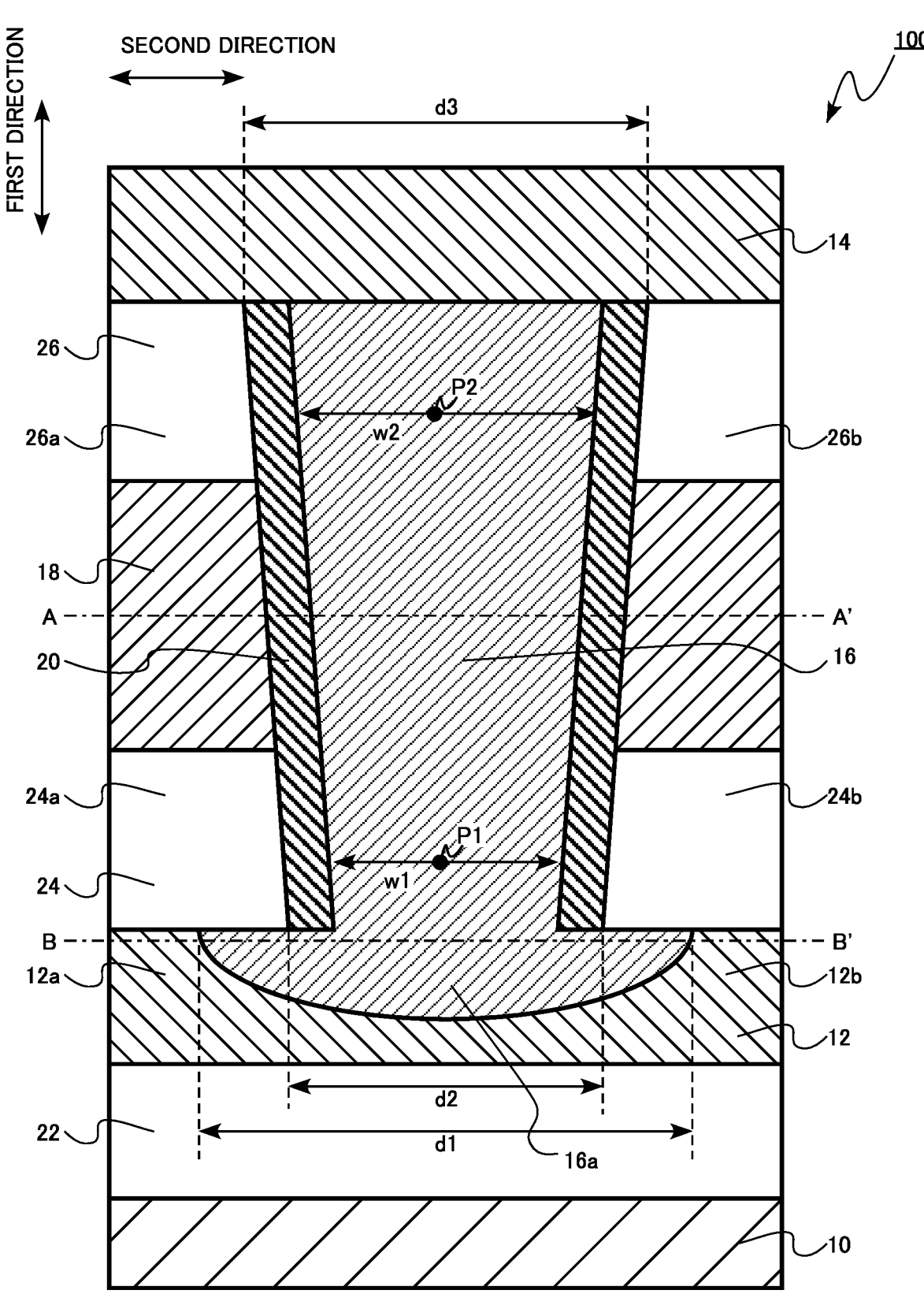
FIG. 1 is a schematic cross-sectional view of a semiconductor device according to a first embodiment.

DETAILED DESCRIPTION semiconductor device of embodiments includes: a first electrode; a second electrode; an oxide semiconductor layer provided between the first electrode and the second electrode and including a first region surrounded by the first electrode in a plane perpendicular to a first direction from the first electrode toward the second electrode; a gate electrode provided between the first electrode and the second electrode in the first direction and facing the oxide semiconductor layer; a gate insulating layer provided between the oxide semiconductor layer and the gate electrode; a first insulating layer provided between the gate electrode and the first electrode; and a second insulating layer provided between the gate electrode and the second electrode. In a cross section parallel to the first direction, the first electrode includes a first portion and a second portion, and the first region is provided between the first portion and the second portion in a second direction perpendicular to the first direction. In the cross section, the first insulating layer includes a third portion and a fourth portion, and the oxide semiconductor layer is provided between the third portion and the fourth portion in the second direction. A first maximum distance between the first portion and the second portion in the second direction is larger than a minimum distance between the third portion and the fourth portion in the second direction.

Hereinafter, embodiments will be described with reference to the accompanying diagram. In addition, in the following description, the same or similar members and the like are denoted by the same reference numerals, and the description of the members and the like once described will be omitted as appropriate.

In addition, in this specification, the term "upper" or "lower" may be used for convenience. "Upper" or "lower" is a term indicating the relative positional relationship in the diagram, but is not a term that defines the positional relationship with respect to gravity.

The qualitative analysis and quantitative analysis of the chemical composition of members configuring the semiconductor device and the semiconductor memory device in this specification can be performed by, for example, secondary ion mass spectrometry (SIMS), energy dispersive X-ray spectroscopy (EDX), and Rutherford back-scattering spectroscopy (RBS). In addition, when measuring the thickness of each member forming the semiconductor device and semiconductor memory device, a distance between members, a crystal particle size, and the like, for example, a transmission electron microscope (TEM) can be used.

First Embodiment

A semiconductor device according to a first embodiment includes: a first electrode; a second electrode; an oxide semiconductor layer provided between the first electrode and the second electrode and including a first region surrounded by the first electrode in a plane perpendicular to a first direction from the first electrode toward the second electrode; a gate electrode facing the oxide semiconductor layer; a gate insulating layer provided between the oxide semiconductor layer and the gate electrode; a first insulating layer provided between the gate electrode and the first electrode; and a second insulating layer provided between the gate electrode and the second electrode. Then, in a cross section parallel to the first direction, the first electrode includes a first portion and a second portion, and the first region is provided between the first portion and the second portion in a second direction perpendicular to the first direction. In addition, in the cross section, the first insulating layer includes a third portion and a fourth portion, and the oxide semiconductor layer is provided between the third portion and the fourth portion in the second direction. A first maximum distance between the first portion and the second portion in the second direction is larger than a minimum distance between the third portion and the fourth portion in the second direction.

Figure 2:
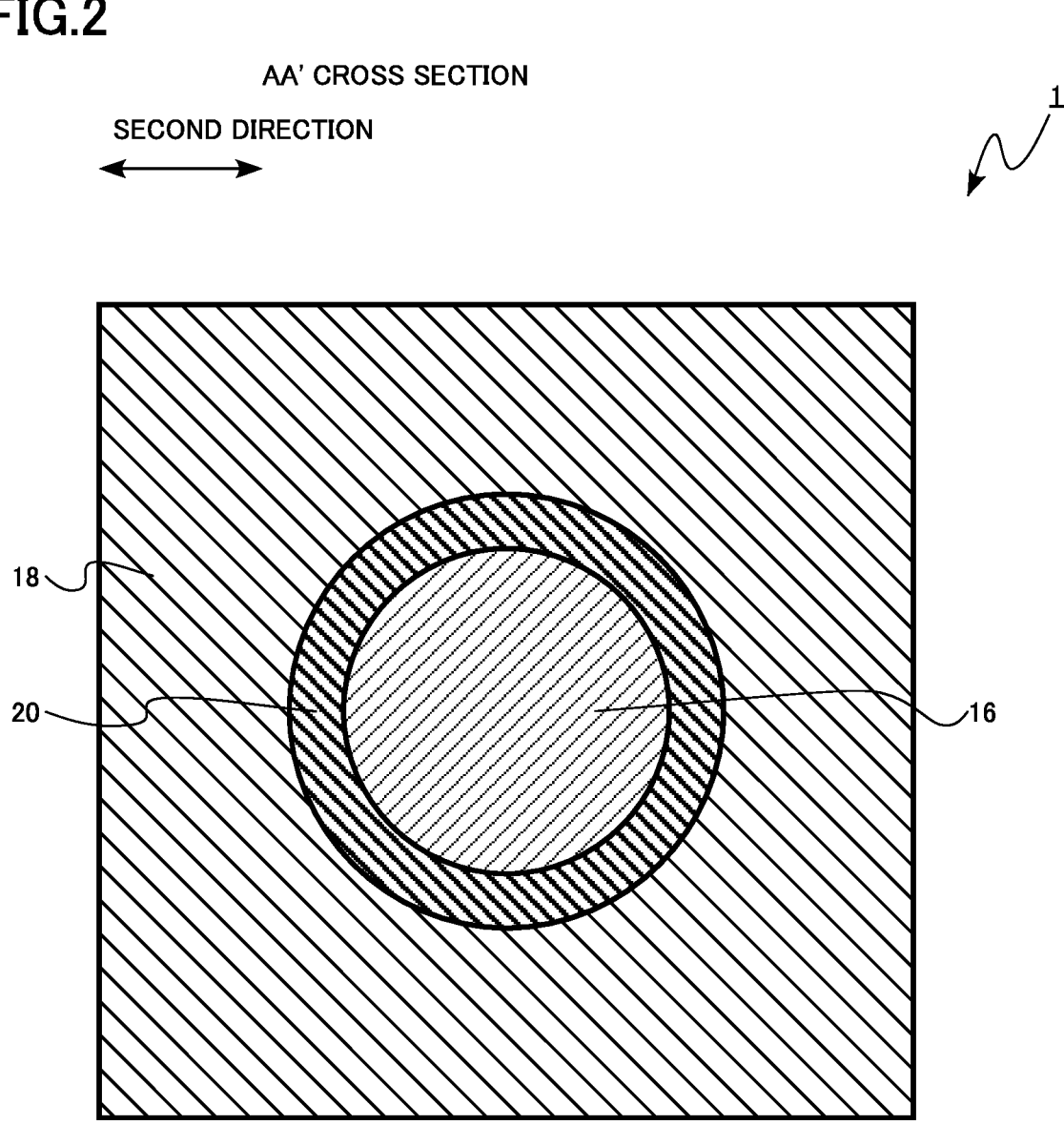
FIG. 2 is a schematic cross-sectional view of the semiconductor device according to the first embodiment.
Figure 3:
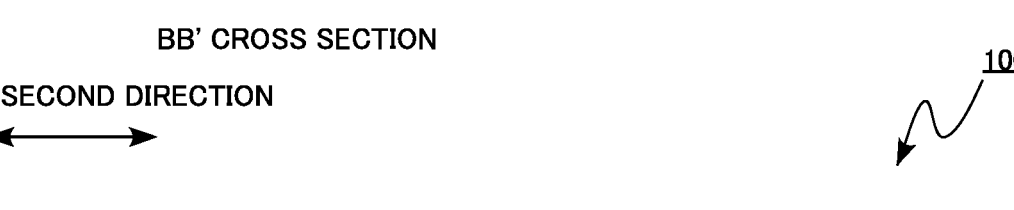
FIG. 3 is a schematic cross-sectional view of the semiconductor device according to the first embodiment.
Figure 3:
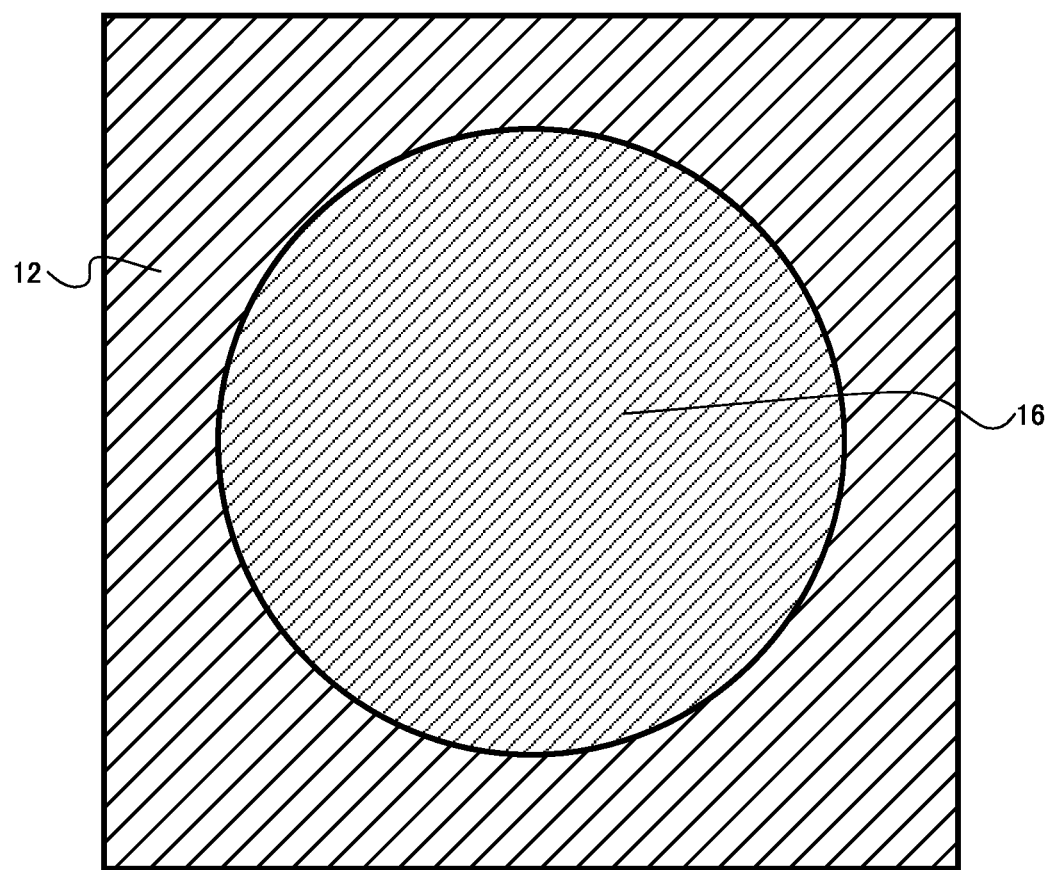

FIGS. 1, 2, and 3 are schematic cross-sectional views of the semiconductor device according to the first embodiment. FIG. 2 is a cross-sectional view taken along the line AA' of FIG. 1. FIG. 3 is a cross-sectional view taken along the line BB' of FIG. 1. In FIG. 1, the vertical direction is referred to as a first direction. In FIG. 1, the horizontal direction is referred to as a second direction. The second direction is perpendicular to the first direction.

The semiconductor device according to the first embodiment is a transistor 100. The transistor 100 is an oxide semiconductor transistor in which a channel is formed in an oxide semiconductor. In the transistor 100, a gate electrode is provided so as to surround an oxide semiconductor layer in which a channel is formed. The transistor 100 is a so-called surrounding gate transistor (SGT). The transistor 100 is a so-called vertical transistor.

The transistor 100 includes a lower electrode 12, an upper electrode 14, an oxide semiconductor layer 16, a gate electrode 18, a gate insulating layer 20, a lower insulating layer 24, and an upper insulating layer 26. The lower electrode 12 includes a first portion 12a and a second portion

4

12b. The oxide semiconductor layer 16 includes a lower region 16a. The lower insulating layer 24 includes a third portion 24a and a fourth portion 24b. The upper insulating layer 26 includes a fifth portion 26a and a sixth portion 26b.

A silicon substrate 10 is an example of a substrate. The lower electrode 12 is an example of the first electrode. The upper electrode 14 is an example of the second electrode. The lower insulating layer 24 is an example of the first insulating layer. The upper insulating layer 26 is an example of the second insulating layer. The lower region 16a is an example of the first region.

The silicon substrate 10 is, for example, single crystal silicon. The substrate is not limited to a silicon substrate. The substrate may be, for example, a semiconductor substrate other than the silicon substrate. The substrate may be, for example, an insulating substrate.

The lower electrode 12 is provided on the silicon substrate 10. A substrate insulating layer 22 is provided between the silicon substrate 10 and the lower electrode 12.

The lower electrode 12 functions as a source electrode or a drain electrode of the transistor 100.

The lower electrode 12 is a conductor. The lower electrode 12 contains, for example, an oxide conductor or a metal. For example, the lower electrode 12 is an oxide conductor containing indium (In), tin (Sn), and oxygen (O). The lower electrode 12 is, for example, indium tin oxide. For example, the lower electrode 12 is a metal containing tungsten (W), molybdenum (Mo), copper (Cu), aluminum (Al), titanium (Ti), or tantalum (Ta).

The lower electrode 12 may have, for example, a stacked structure of a plurality of conductors.

The upper electrode 14 is provided on the silicon substrate 10. The upper electrode 14 is provided on the lower electrode 12. The lower electrode 12 is provided between the silicon substrate 10 and the upper electrode 14. The direction from the lower electrode 12 toward the upper electrode 14 is the first direction.

The upper electrode 14 functions as a source electrode or a drain electrode of the transistor 100.

The upper electrode 14 is a conductor. The upper electrode 14 contains, for example, an oxide conductor or a metal. For example, the upper electrode 14 is an oxide conductor containing indium (In), tin (Sn), and oxygen (O). The upper electrode 14 is, for example, indium tin oxide. For example, the upper electrode 14 is a metal containing tungsten (W), molybdenum (Mo), copper (Cu), aluminum (Al), titanium (Ti), or tantalum (Ta).

The upper electrode 14 may have, for example, a stacked structure of a plurality of conductors.

The lower electrode 12 and the upper electrode 14 are formed of, for example, the same material. For example, the lower electrode 12 and the upper electrode 14 are oxide conductors containing indium (In), tin (Sn), and oxygen (O). The lower electrode 12 and the upper electrode 14 are, for example, indium tin oxide.

The oxide semiconductor layer 16 is provided on the silicon substrate 10. The oxide semiconductor layer 16 is provided between the lower electrode 12 and the upper electrode 14. The oxide semiconductor layer 16 is in contact with, for example, the lower electrode 12. The oxide semiconductor layer 16 is in contact with, for example, the upper electrode 14.

A channel serving as a current path is formed in the oxide semiconductor layer 16 when the transistor 100 is turned on.

The oxide semiconductor layer 16 is an oxide semiconductor. The oxide semiconductor layer 16 is, for example, amorphous.

The oxide semiconductor layer 16 contains, for example, zinc (Zn), oxygen (O), and at least one element selected from a group consisting of indium (In), gallium (Ga), silicon (Si), aluminum (Al), and tin (Sn). For example, the oxide semiconductor layer 16 contains indium (In), gallium (Ga), and zinc (Zn).

The oxide semiconductor layer 16 contains, for example, at least one element selected from a group consisting of titanium (Ti), zinc (Zn), and tungsten (W). For example, the oxide semiconductor layer 16 contains titanium oxide, zinc oxide, or tungsten oxide.

The oxide semiconductor layer 16 has a chemical composition different from the chemical composition of the lower electrode 12 and the chemical composition of the upper electrode 14, for example.

The oxide semiconductor layer 16 includes the lower region 16a. As shown in FIG. 3, the lower region 16a is surrounded by the lower electrode 12 in a plane perpendicular to the first direction.

The oxide semiconductor layer 16 includes an oxygen vacancy. The oxygen vacancy in the oxide semiconductor layer 16 functions as a donor.

In the cross section of the oxide semiconductor layer 16 parallel to the first direction, the first width (w1 in FIG. 1) of the oxide semiconductor layer 16 in the second direction at a first position (P1 in FIG. 1) in the oxide semiconductor layer 16 is smaller than the second width (w2 in FIG. 1) of the oxide semiconductor layer 16 in the second direction at a second position (P2 in FIG. 1) closer to the upper electrode 14 than the first position P1 in the oxide semiconductor layer 16.

The width of the oxide semiconductor layer 16 in the second direction decreases from the upper electrode 14 toward the lower electrode 12, for example. The side surface of the oxide semiconductor layer 16 has a forward tapered shape.

The length of the oxide semiconductor layer 16 in the first direction is, for example, equal to or more than 80 nm and equal to or less than 200 nm. The width of the oxide semiconductor layer 16 in the second direction is, for example, equal to or more than 20 nm and equal to or less than 100 nm.

The gate electrode 18 is provided so that the position coordinates of the gate electrode 18 in the first direction are a value between the position coordinates of the lower electrode 12 and the position coordinates of the upper electrode 14 in the first direction. The gate electrode 18 faces the oxide semiconductor layer 16.

As shown in FIG. 2, the gate electrode 18 is provided so as to surround the oxide semiconductor layer 16. The gate electrode 18 is provided around the oxide semiconductor layer 16.

The gate electrode 18 is, for example, a metal, a metal compound, or a semiconductor. The gate electrode 18 contains, for example, tungsten (W).

The length of the gate electrode 18 in the first direction is, for example, equal to or more than 20 nm and equal to or less than 100 nm.

The gate insulating layer 20 is provided between the oxide semiconductor layer 16 and the gate electrode 18. The gate insulating layer 20 is provided so as to surround the oxide semiconductor layer 16.

The gate insulating layer 20 is, for example, an oxide or an oxynitride. The gate insulating layer 20 contains, for example, silicon oxide or aluminum oxide. The thickness of the gate insulating layer 20 is, for example, equal to or more than 2 nm and equal to or less than 10 nm.

The substrate insulating layer 22 is provided between the silicon substrate 10 and the lower electrode 12. The substrate insulating layer 22 is, for example, an oxide, a nitride, or an oxynitride. The substrate insulating layer 22 contains, for example, silicon oxide, silicon nitride, or silicon oxynitride. The substrate insulating layer 22 is, for example, silicon oxide, silicon nitride, or silicon oxynitride.

The lower insulating layer 24 is provided on the lower electrode 12. The lower insulating layer 24 is provided between the gate electrode 18 and the lower electrode 12.

The lower insulating layer 24 surrounds the oxide semiconductor layer 16. The lower insulating layer 24 surrounds the gate insulating layer 20. A gate insulating layer 20 is provided between the lower insulating layer 24 and the oxide semiconductor layer 16.

The lower insulating layer 24 is, for example, an oxide, a nitride, or an oxynitride. The lower insulating layer 24 contains, for example, silicon oxide, silicon nitride, or silicon oxynitride. The lower insulating layer 24 includes, for example, a silicon oxide layer, a silicon nitride layer, or a silicon oxynitride layer. The lower insulating layer 24 is, for example, a silicon oxide layer, a silicon nitride layer, or a silicon oxynitride layer.

The upper insulating layer 26 is provided on the gate electrode 18. The upper insulating layer 26 is provided between the gate electrode 18 and the upper electrode 14.

The upper insulating layer 26 surrounds the oxide semiconductor layer 16. The upper insulating layer 26 surrounds the gate insulating layer 20. The gate insulating layer 20 is provided between the upper insulating layer 26 and the oxide semiconductor layer 16.

The upper insulating layer 26 is, for example, an oxide, a nitride, or an oxynitride. The upper insulating layer 26 contains, for example, silicon oxide, silicon nitride, or silicon oxynitride. The upper insulating layer 26 includes, for example, a silicon oxide layer, a silicon nitride layer, or a silicon oxynitride layer. The upper insulating layer 26 is, for example, a silicon oxide layer, a silicon nitride layer, or a silicon oxynitride layer.

A first maximum distance (d1 in FIG. 1) in the second direction between the first portion 12a of the lower electrode 12 and the second portion 12b of the lower electrode 12 in a cross section parallel to the first direction and including the oxide semiconductor layer 16 is larger than a minimum distance (d2 in FIG. 1) in the second direction between the third portion 24a of the lower insulating layer 24 and the fourth portion 24b of the lower insulating layer 24 in the cross section.

FIG. 1 is an example of the cross section parallel to the first direction and including the oxide semiconductor layer 16. In the second direction, the lower region 16a of the oxide semiconductor layer 16 is provided between the first portion 12a and the second portion 12b. In addition, in the second direction, the oxide semiconductor layer 16 is provided between the third portion 24a and the fourth portion 24b.

The first maximum distance d1 is, for example, equal to or more than 1.2 times and equal to or less than twice the minimum distance d2.

In addition, for example, the first maximum distance d1 is larger than a second maximum distance (d3 in FIG. 1) in the second direction between the fifth portion 26a of the upper insulating layer 26 and the sixth portion 26b of the upper insulating layer 26 in the above-described cross section. In the second direction, the oxide semiconductor layer 16 is provided between the fifth portion 26a and the sixth portion 26b.

The first maximum distance d1 is, for example, equal to or more than 1.1 times and equal to or less than 1.5 times the second maximum distance d3.

Next, a first example of a semiconductor device manufacturing method according to the first embodiment will be described.

In the first example of the semiconductor device manufacturing method according to the first embodiment, a first conductive film, a first insulating film, a conductive layer, and a second insulating film are stacked in a first direction, a hole penetrating the second insulating film, the conductive layer, and the first insulating film and reaching the first conductive film is formed, a recess extending in a second direction perpendicular to the first direction is formed by etching the first conductive film exposed at a bottom of the hole, an oxide semiconductor film is formed inside the recess and the hole, and a second conductive film is formed. In addition, before forming the recess, a third insulating film is formed inside the hole, and before forming the recess, a bottom of the third insulating film is etched to expose the first conductive film. In addition, after forming the third insulating film, a protective film is formed inside the hole before the first conductive film is exposed, and after forming the recess, the protective film is removed before the oxide semiconductor film is formed.

FIGS. 4 to 13 are schematic cross-sectional views showing a first example of a semiconductor memory device manufacturing method according to the first embodiment. FIGS. 4 to 13 each show a cross section corresponding to FIG. 1. FIGS. 4 to 13 are diagrams showing a first example of a method for manufacturing the transistor 100.

Figure 4:
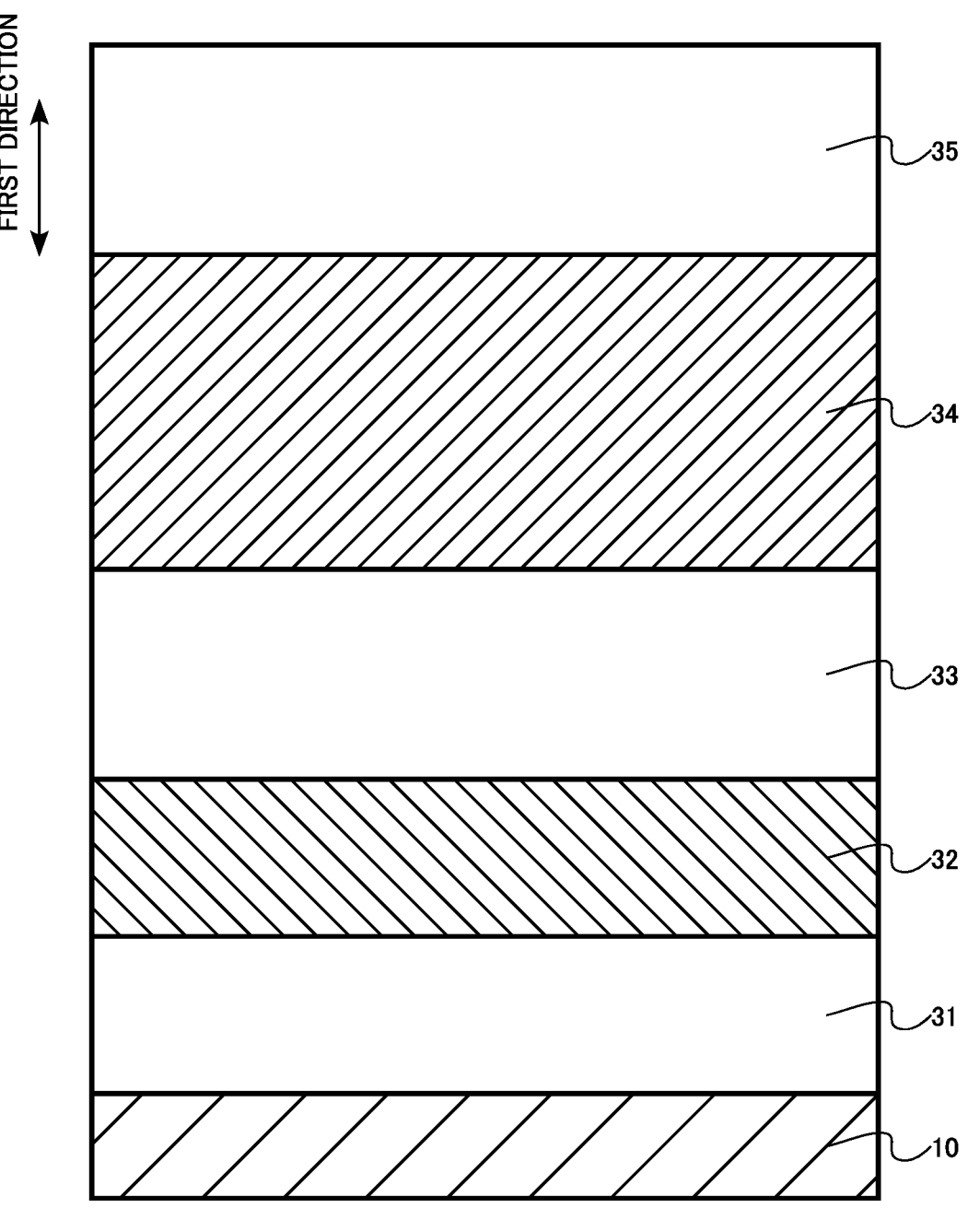
FIG. 4 is a schematic cross-sectional view showing a first example of a semiconductor memory device manufacturing method according to the first embodiment.

First, a first silicon oxide film 31, a first indium tin oxide film 32, a second silicon oxide film 33, a tungsten layer 34, and a third silicon oxide film 35 are stacked on the silicon substrate 10 in this order in the first direction (FIG. 4). The first indium tin oxide film 32 is an example of the first conductive film. The second silicon oxide film 33 is an example of the first insulating film. The tungsten layer 34 is an example of a conductive layer. The third silicon oxide film 35 is an example of the second insulating film. The first silicon oxide film 31, the first indium tin oxide film 32, the second silicon oxide film 33, the tungsten layer 34, and the third silicon oxide film 35 are formed by using, for example, a chemical vapor deposition method (CVD method).

The first silicon oxide film 31 finally becomes the substrate insulating layer 22. A part of the first indium tin oxide film 32 finally becomes the lower electrode 12. A part of the second silicon oxide film 33 finally becomes the lower insulating layer 24. A part of the tungsten layer 34 finally becomes the gate electrode 18. A part of the third silicon oxide film 35 finally becomes the upper insulating layer 26.

Figure 5:
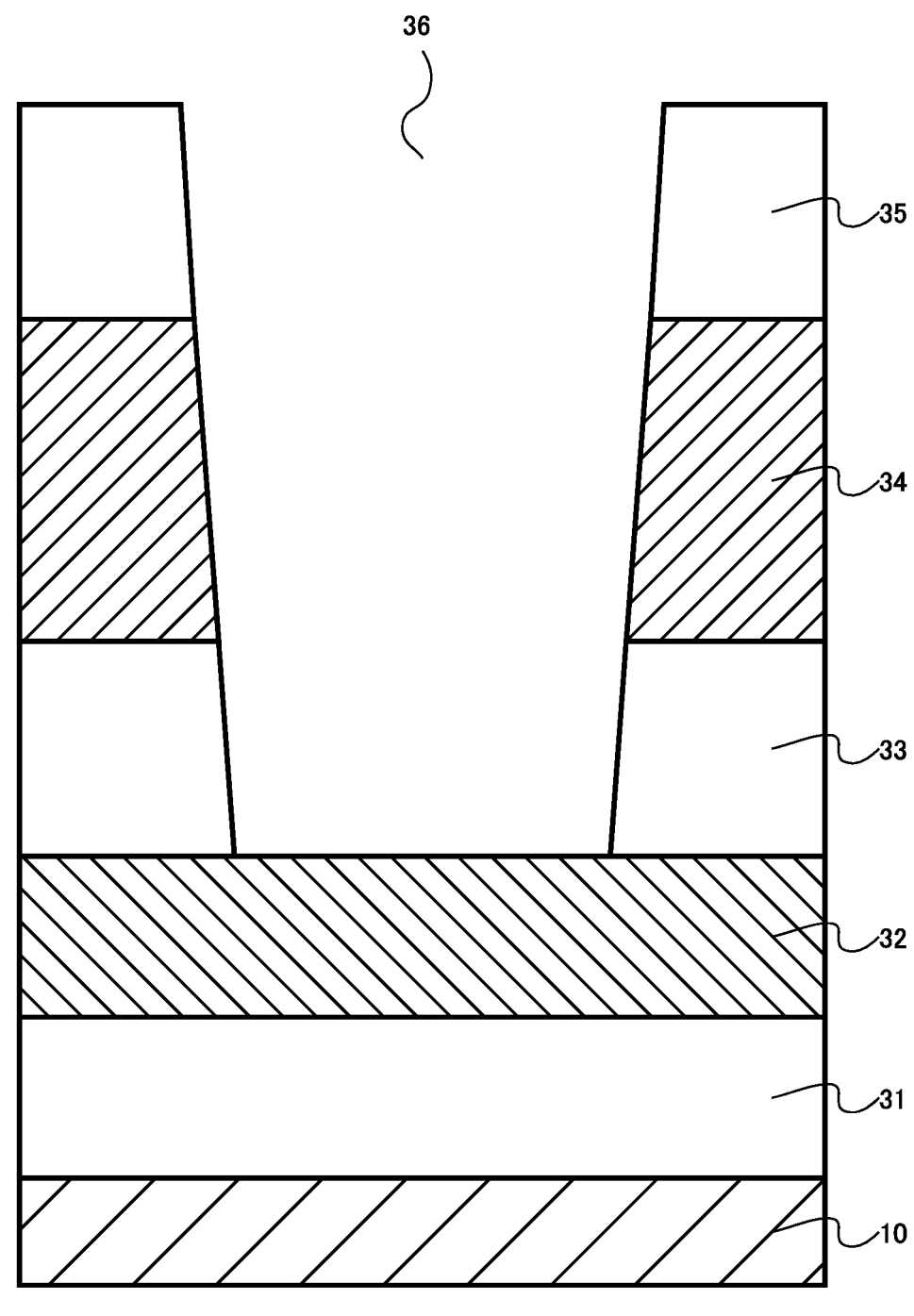
FIG. 5 is a schematic cross-sectional view showing the first example of the semiconductor memory device manufacturing method according to the first embodiment.

Then, an opening 36 that penetrates the third silicon oxide film 35, the tungsten layer 34, and the second silicon oxide film 33 from the surface of the third silicon oxide film 35 and reaches the first indium tin oxide film 32 is formed (FIG. 5). The opening 36 is an example of a hole. The opening 36 has a forward tapered shape in which the hole diameter decreases toward the first indium tin oxide film 32. The opening 36 is formed by using, for example, a lithography method and a reactive ion etching method (RIE method).

Figure 6:
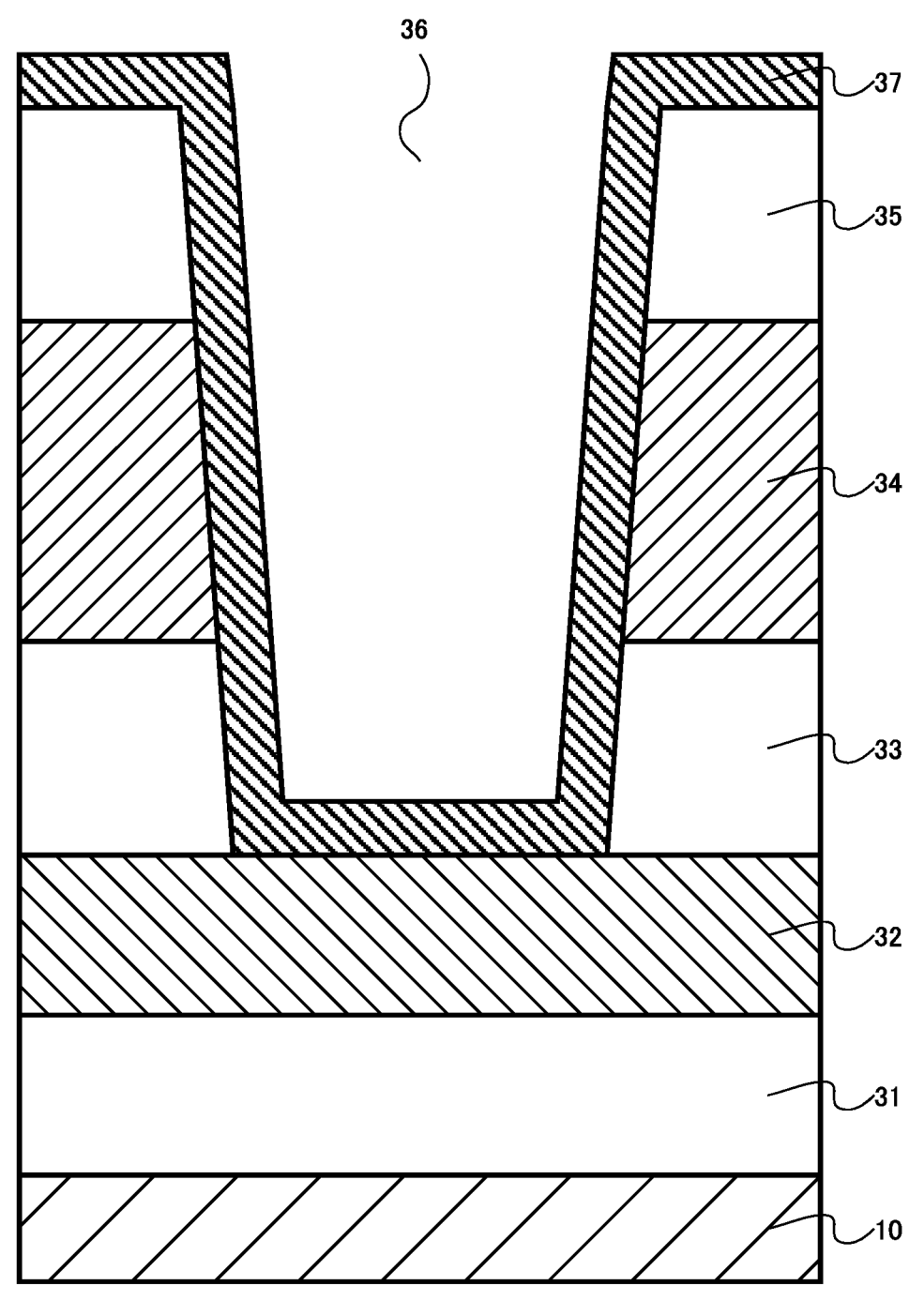
FIG. 6 is a schematic cross-sectional view showing the first example of the semiconductor memory device manufacturing method according to the first embodiment.

Then, a fourth silicon oxide film 37 is formed inside the opening 36 (FIG. 6). The fourth silicon oxide film 37 is an example of the third insulating film. The fourth silicon oxide film 37 is formed by using, for example, a CVD method. A part of the fourth silicon oxide film 37 finally becomes the gate insulating layer 20.

Figure 7:
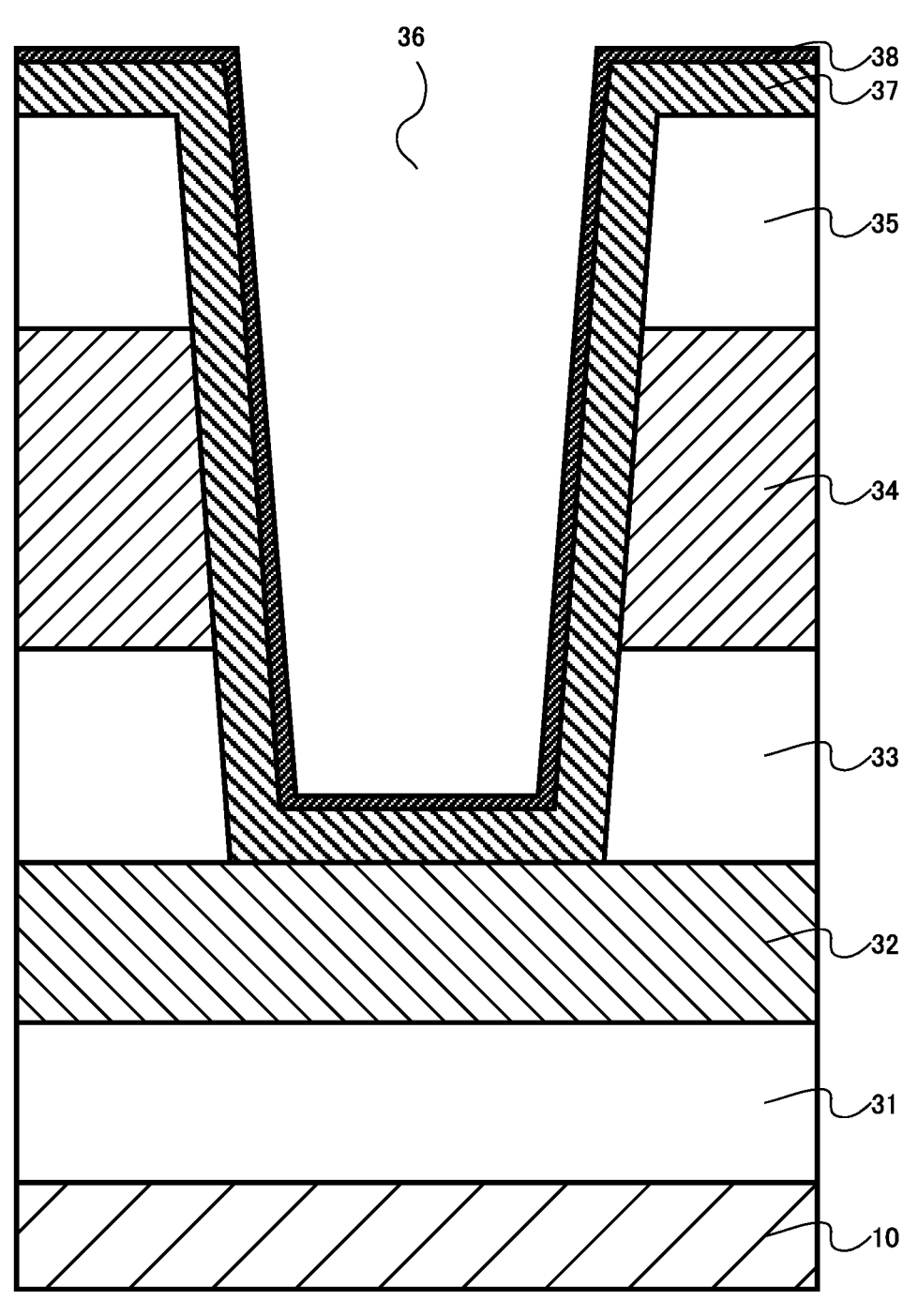
FIG. 7 is a schematic cross-sectional view showing the first example of the semiconductor memory device manufacturing method according to the first embodiment.

Then, an amorphous silicon film 38 is formed inside the opening 36 (FIG. 7). The amorphous silicon film 38 is an example of a protective film. The amorphous silicon film 38 is formed on the fourth silicon oxide film 37. The amorphous silicon film 38 is formed by using, for example, a CVD method.

Figure 8:
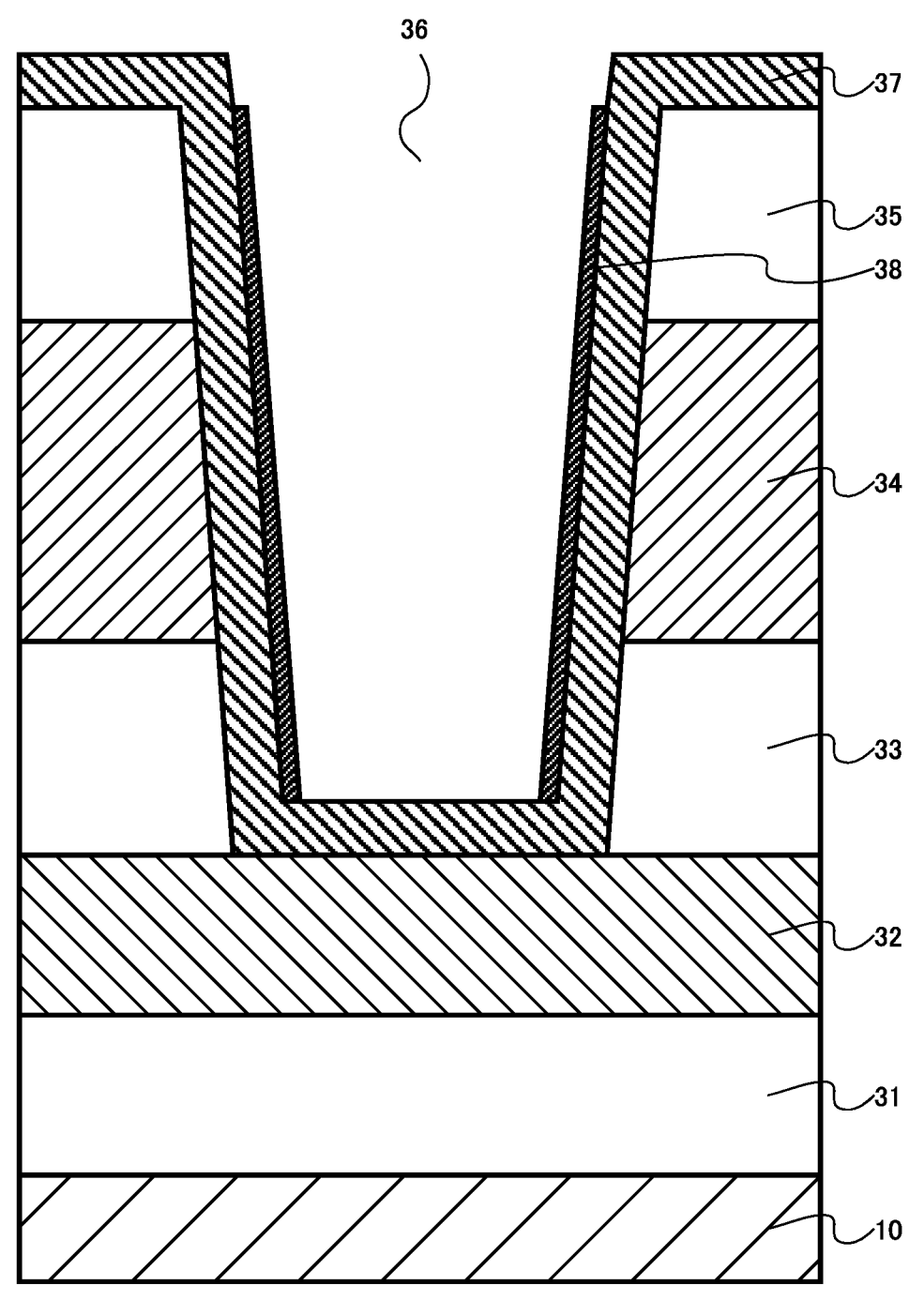
FIG. 8 is a schematic cross-sectional view showing the first example of the semiconductor memory device manufacturing method according to the first embodiment.

Then, the amorphous silicon film 38 at the bottom of the opening 36 is etched to expose the fourth silicon oxide film 37 (FIG. 8). The amorphous silicon film 38 is etched by using, for example, an RIE method.

Figure 9:
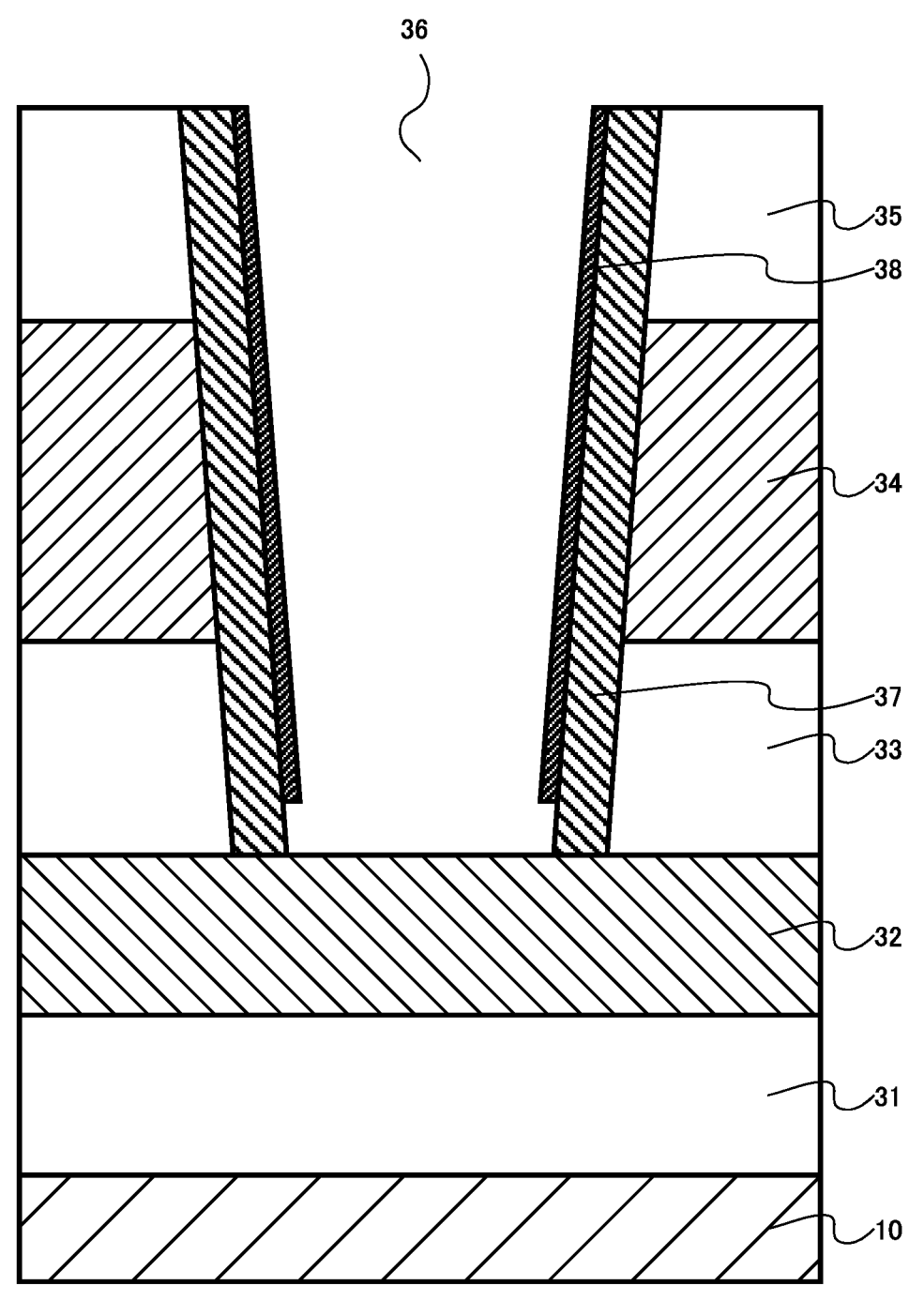
FIG. 9 is a schematic cross-sectional view showing the first example of the semiconductor memory device manufacturing method according to the first embodiment.

Then, the fourth silicon oxide film 37 at the bottom of the opening 36 is etched to expose the first indium tin oxide film 32 (FIG. 9). The fourth silicon oxide film 37 is etched by using, for example, an RIE method.

The amorphous silicon film 38 prevents the fourth silicon oxide film 37 on the side surface of the opening 36 from being etched when the fourth silicon oxide film 37 at the bottom of the opening 36 is etched.

Figure 10:
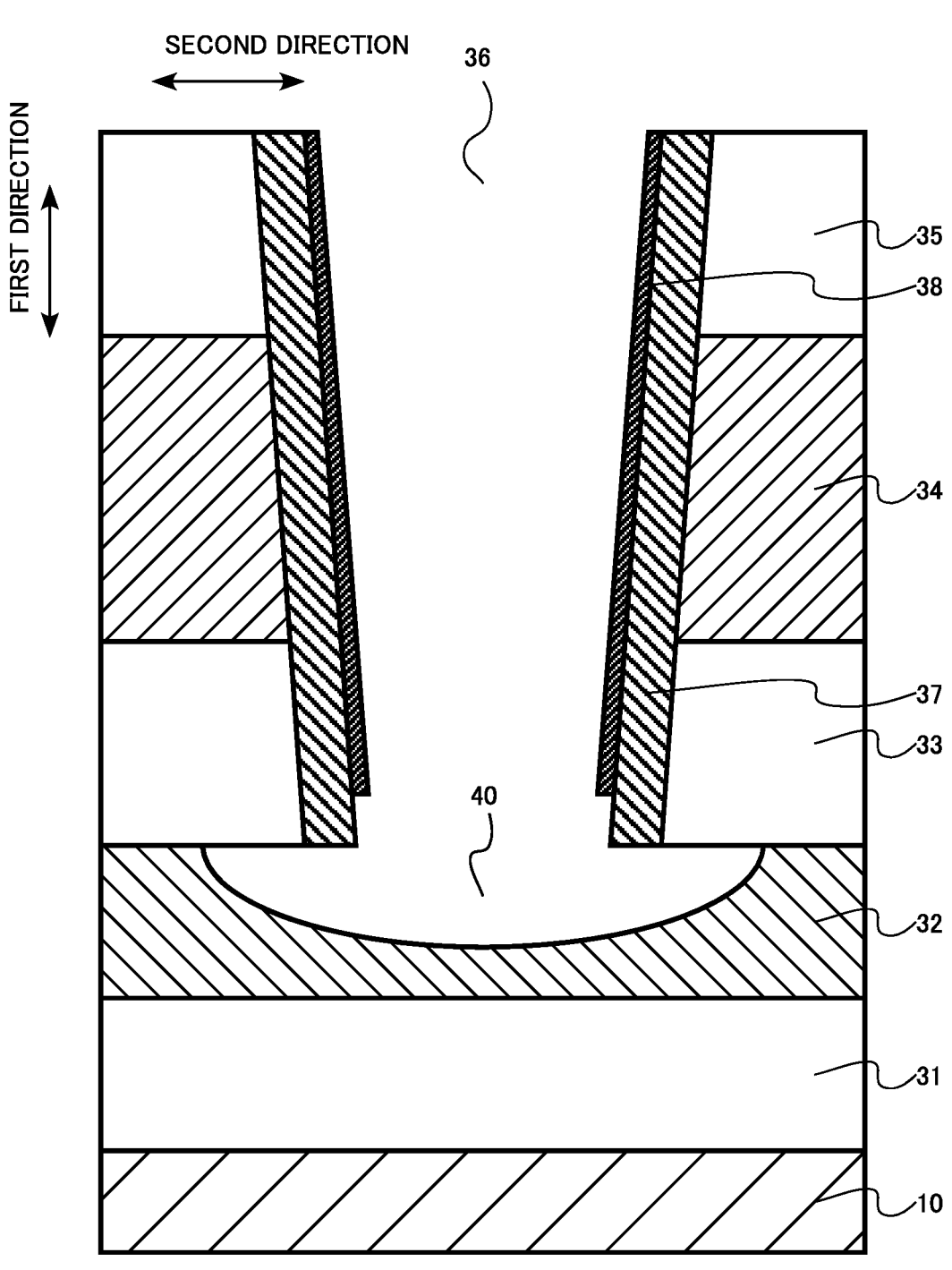
FIG. 10 is a schematic cross-sectional view showing the first example of the semiconductor memory device manufacturing method according to the first embodiment.

Then, the first indium tin oxide film 32 exposed at the bottom of the opening 36 is etched to form a recess 40 extending in the second direction perpendicular to the first direction (FIG. 10). When forming the recess 40, for example, isotropic etching is performed. When forming the recess 40, for example, the first indium tin oxide film 32 is isotropically etched. A dry etching method or a wet etching method is used for etching the first indium tin oxide film 32.

When forming the recess 40, etching is performed, for example, in a plasma atmosphere containing chlorine or ammonia. By performing etching in a plasma atmosphere containing chlorine or ammonia, for example, it is possible to suppress the etching of the second silicon oxide film 33 or the fourth silicon oxide film 37.

The amorphous silicon film 38 prevents the fourth silicon oxide film 37 on the side surface of the opening 36 from being etched when the recess 40 is formed.

Figure 11:
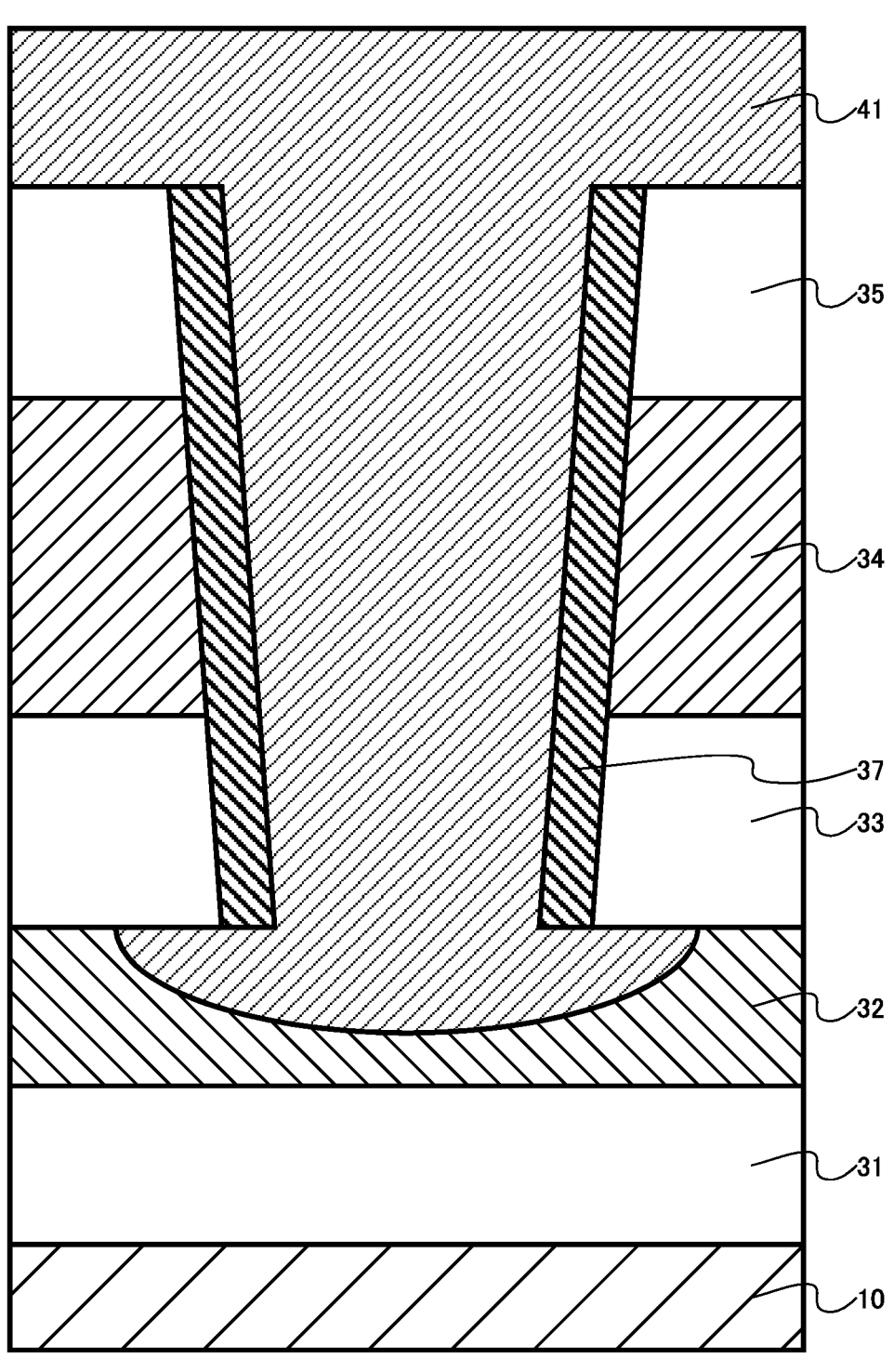
FIG. 11 is a schematic cross-sectional view showing the first example of the semiconductor memory device manufacturing method according to the first embodiment.

Then, the amorphous silicon film 38 is removed. The amorphous silicon film 38 is removed by using, for example, a dry etching method. Then, an oxide semiconductor film 41 is buried in the opening 36 (FIG. 11). A part of the oxide semiconductor film 41 becomes the oxide semiconductor layer 16. The oxide semiconductor film 41 buried in the recess 40 becomes the lower region 16a of the oxide semiconductor layer 16.

The oxide semiconductor film 41 contains, for example, indium (In), gallium (Ga), and zinc (Zn). The oxide semiconductor film 41 is formed by using, for example, a CVD method.

Figure 12:
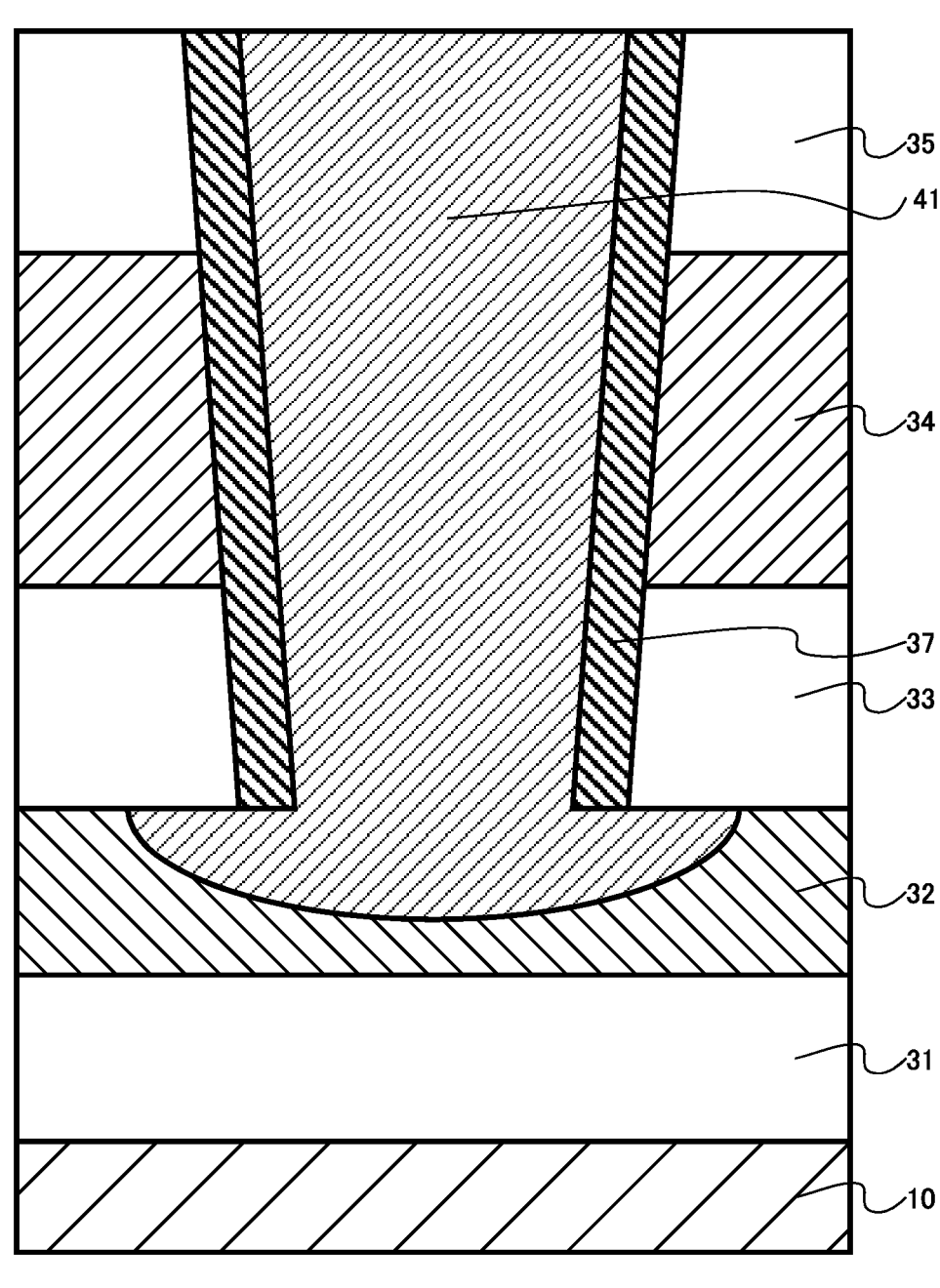
FIG. 12 is a schematic cross-sectional view showing the first example of the semiconductor memory device manufacturing method according to the first embodiment.

Then, an upper part of the oxide semiconductor film 41 is removed to expose the surface of the third silicon oxide film 35 (FIG. 12). For example, the oxide semiconductor film 41 is removed by etching using an RIE method.

Figure 13:
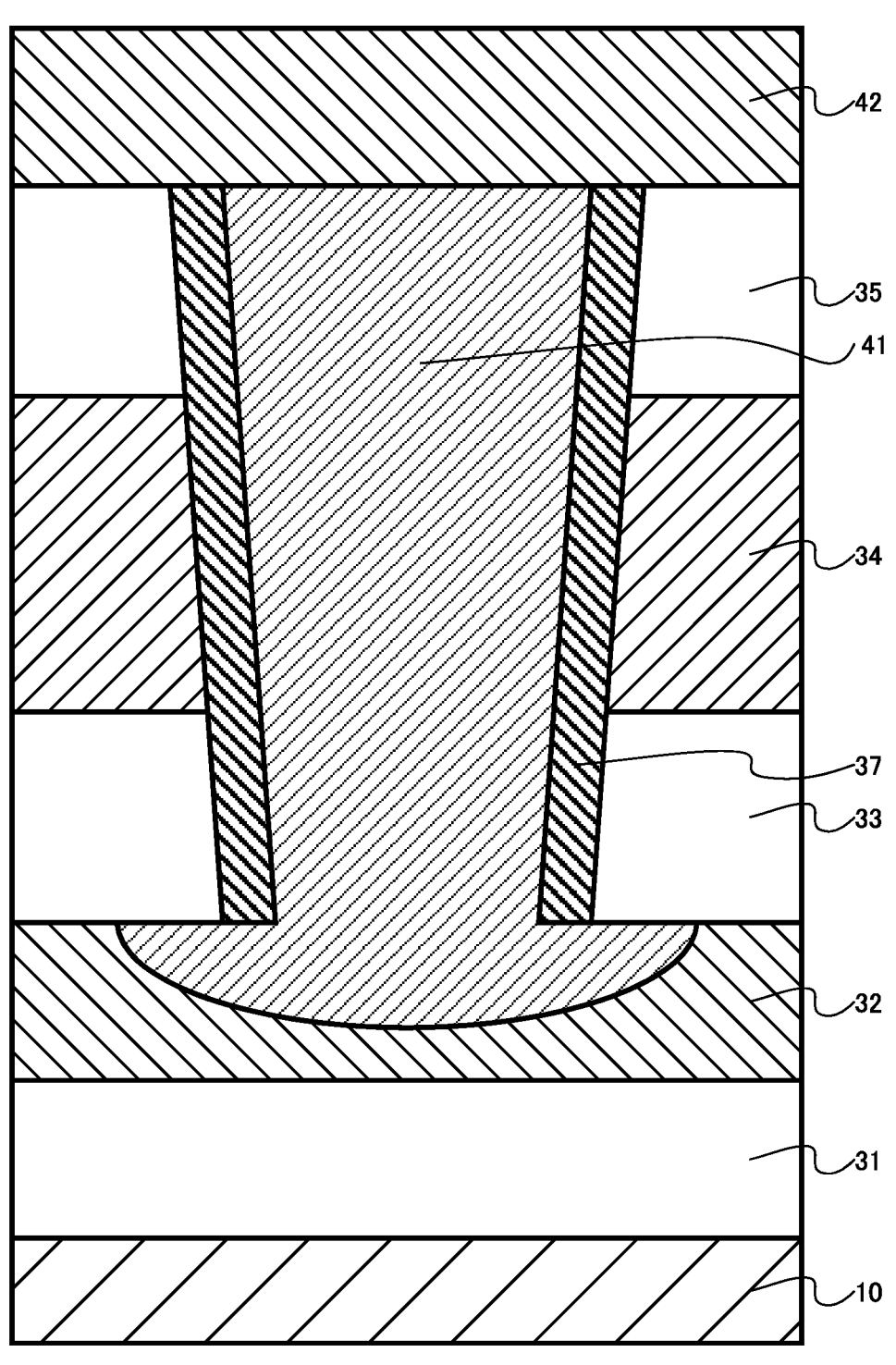
FIG. 13 is a schematic cross-sectional view showing the first example of the semiconductor memory device manufacturing method according to the first embodiment.

Then, a second indium tin oxide film 42 is formed (FIG. 13). The second indium tin oxide film 42 is an example of the second conductive film. The second indium tin oxide film 42 is formed by using, for example, a CVD method. The second indium tin oxide film 42 finally becomes the upper electrode 14.

By the manufacturing method described above, the transistor 100 shown in FIGS. 1, 2, and 3 is manufactured.

Next, a second example of the semiconductor device manufacturing method according to the first embodiment will be described.

In the second example of the semiconductor device manufacturing method according to the first embodiment, a first conductive film, a first insulating film, an insulating layer, and a second insulating film are stacked in a first direction, a hole penetrating the second insulating film, the insulating layer, and the first insulating film and reaching the first conductive film is formed, a recess extending in a second direction perpendicular to the first direction is formed by etching the first conductive film exposed at a bottom of the hole, an oxide semiconductor film is formed inside the recess and the hole, a second conductive film is formed, the insulating layer is removed, and a conductive layer is formed in a region where the insulating layer has been removed. In addition, before forming the recess, a third insulating film is formed inside the hole, and before forming the recess, a bottom of the third insulating film is etched to expose the first conductive film. In addition, after forming the third insulating film, a protective film is formed inside the hole before the first conductive film is exposed, and after forming the recess, the protective film is removed before the oxide semiconductor film is formed.

FIGS. 14 to 18 are schematic cross-sectional views showing a second example of the semiconductor memory device manufacturing method according to the first embodiment. FIGS. 14 to 18 each show a cross section corresponding to FIG. 1. FIGS. 14 to 18 are diagrams showing a second example of a method for manufacturing the transistor 100.

Figure 14:
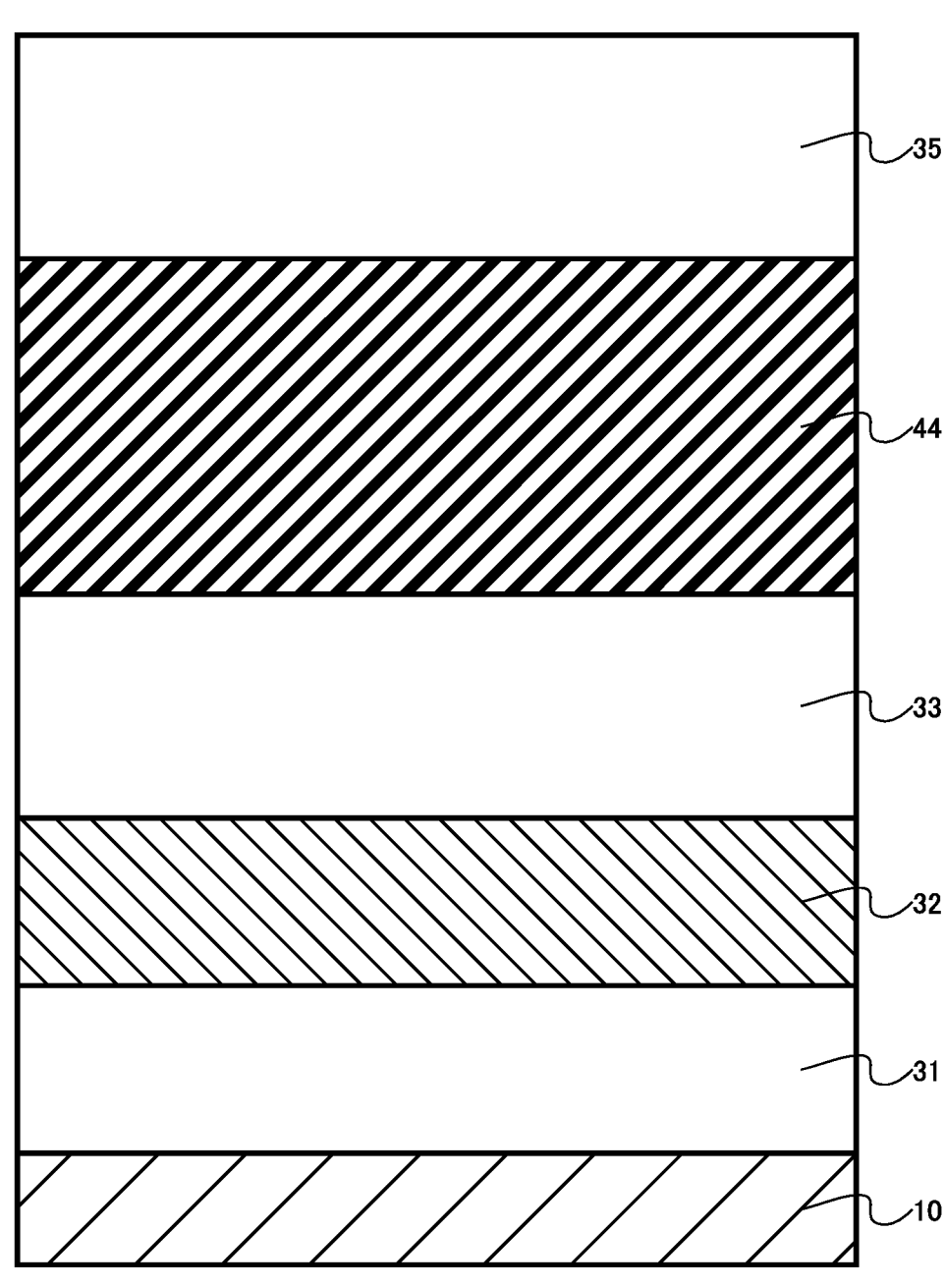
FIG. 14 is a schematic cross-sectional view showing a second example of the semiconductor memory device manufacturing method according to the first embodiment.

First, a first silicon oxide film 31, a first indium tin oxide film 32, a second silicon oxide film 33, a silicon nitride layer 44, and a third silicon oxide film 35 are stacked on the silicon substrate 10 in this order in the first direction (FIG. 14). The first indium tin oxide film 32 is an example of the first conductive film. The second silicon oxide film 33 is an example of the first insulating film. The silicon nitride layer 44 is an example of an insulating layer. The third silicon oxide film 35 is an example of the second insulating film. The first silicon oxide film 31, the first indium tin oxide film 32, the second silicon oxide film 33, the silicon nitride layer 44, and the third silicon oxide film 35 are formed by using, for example, a CVD method.

The first silicon oxide film 31 finally becomes the substrate insulating layer 22. A part of the first indium tin oxide film 32 finally becomes the lower electrode 12. A part of the second silicon oxide film 33 finally becomes the lower insulating layer 24. A part of the third silicon oxide film 35 finally becomes the upper insulating layer 26.

Figure 15:
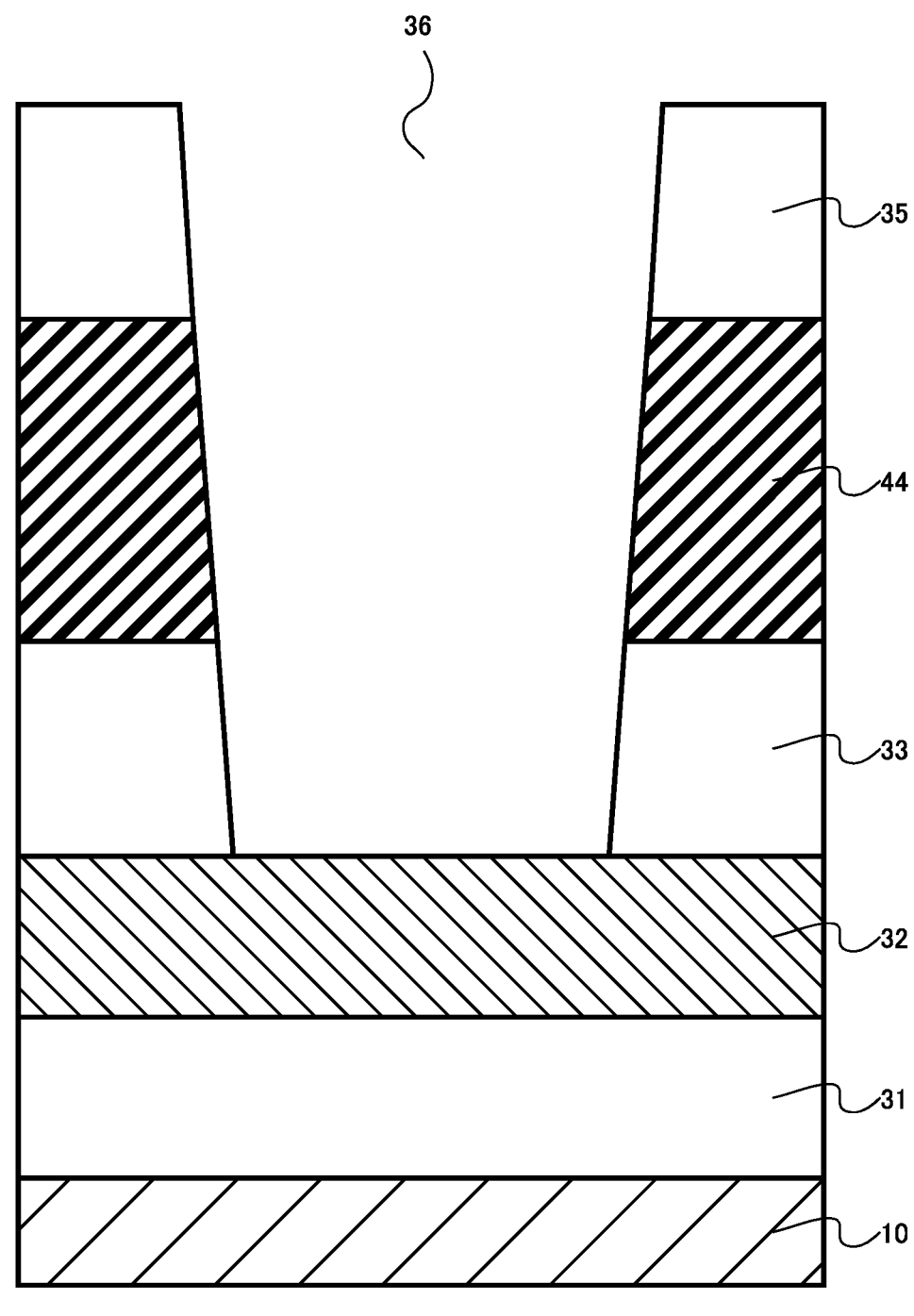
FIG. 15 is a schematic cross-sectional view showing the second example of the semiconductor memory device manufacturing method according to the first embodiment.

Then, an opening 36 that penetrates the third silicon oxide film 35, the silicon nitride layer 44, and the second silicon oxide film 33 from the surface of the third silicon oxide film 35 and reaches the first indium tin oxide film 32 is formed (FIG. 15). The opening 36 is an example of a hole. The opening 36 has a forward tapered shape in which the hole diameter decreases toward the first indium tin oxide film 32. The opening 36 is formed by using, for example, a lithography method and an RIE method.

Figure 16:
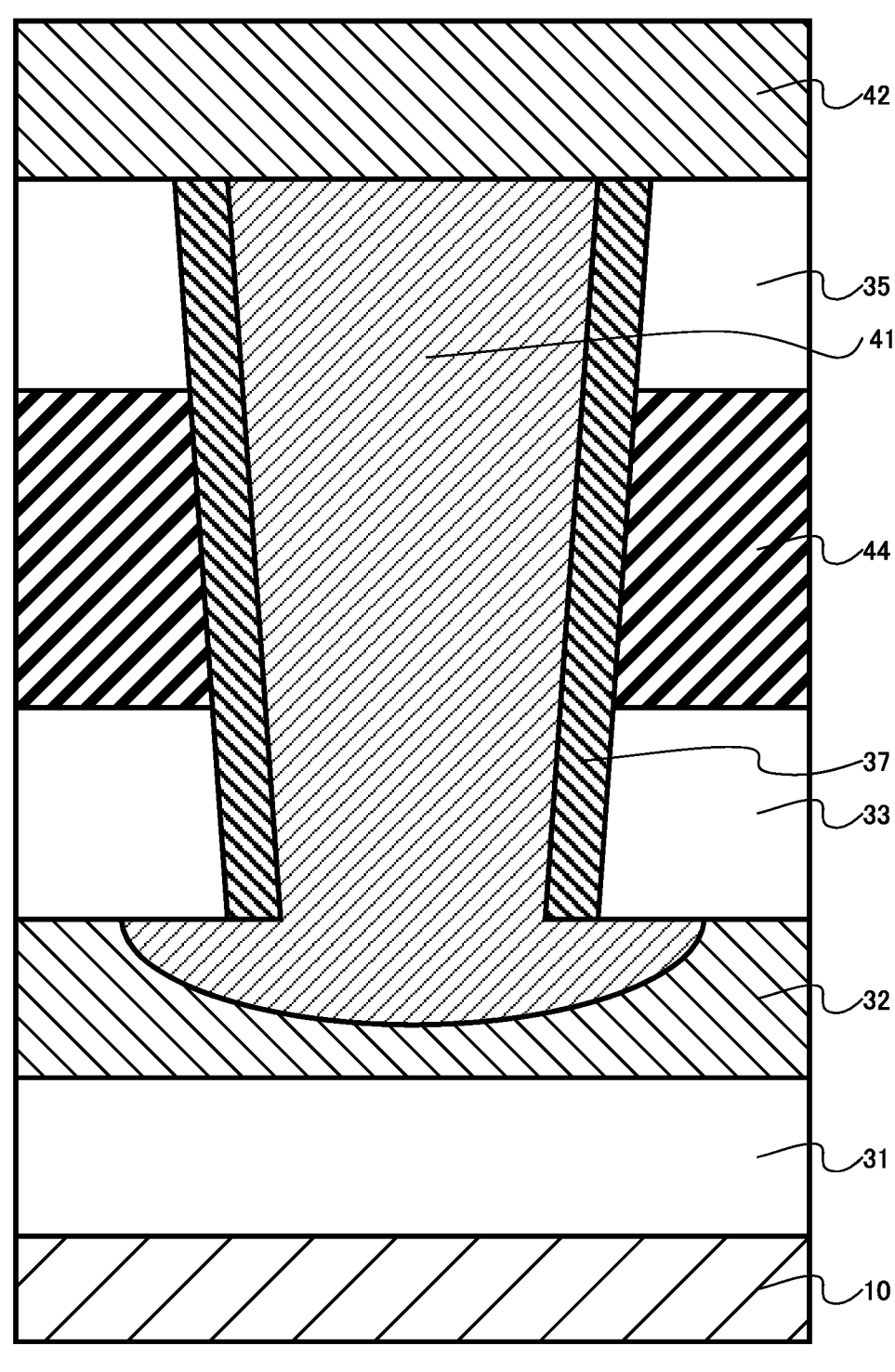
FIG. 16 is a schematic cross-sectional view showing the second example of the semiconductor memory device manufacturing method according to the first embodiment.

Then, the structure shown in FIG. 16 is formed by using the same method as the method shown in FIGS. 6 to 13 in the first example of the semiconductor memory device manufacturing method according to the first embodiment.

Figure 17:
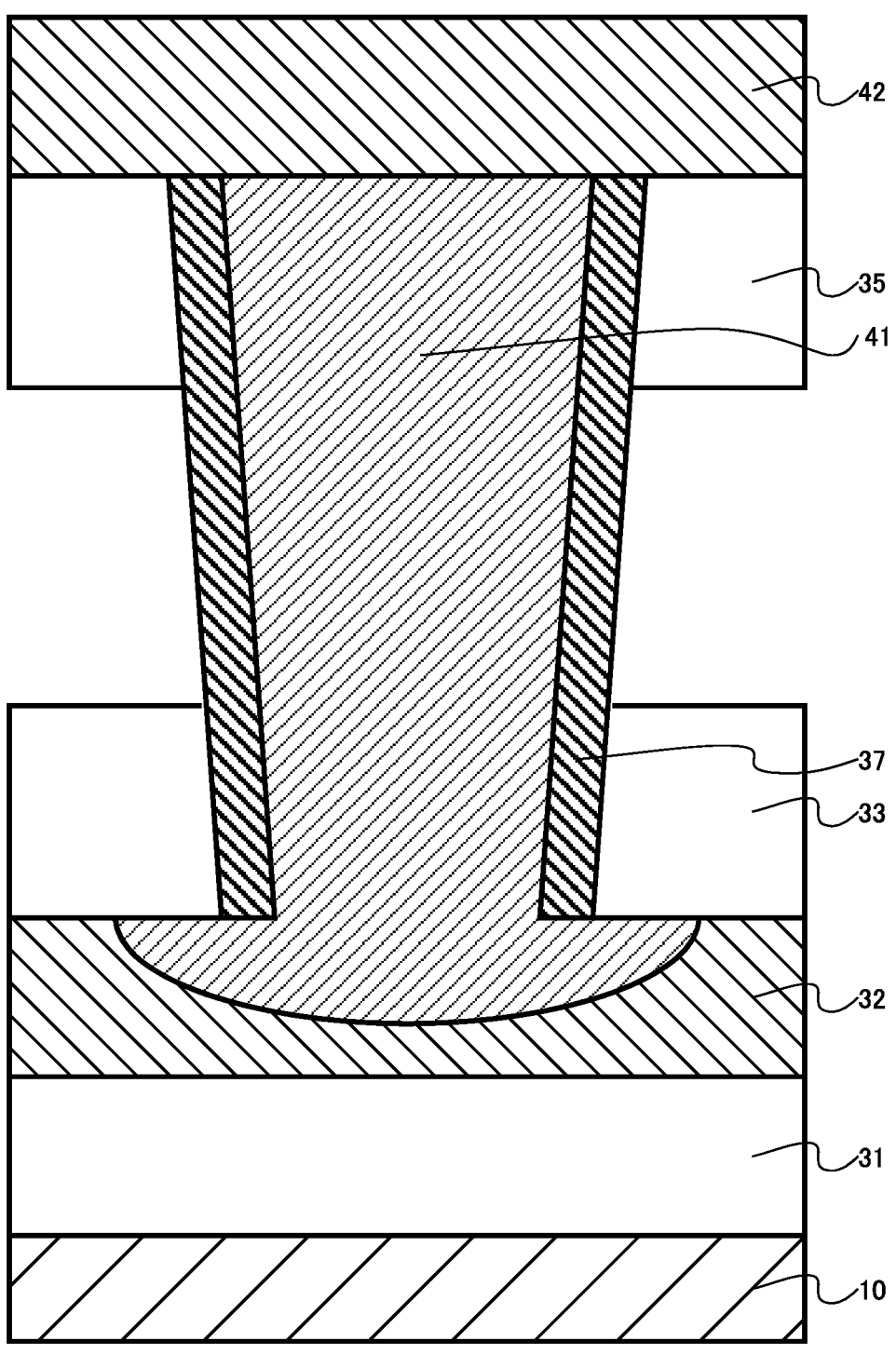
FIG. 17 is a schematic cross-sectional view showing the second example of the semiconductor memory device manufacturing method according to the first embodiment.

Then, the silicon nitride layer 44 is selectively removed by using an opening (not shown), for example (FIG. 17). For example, the silicon nitride layer 44 is removed by using a wet etching method.

Figure 18:
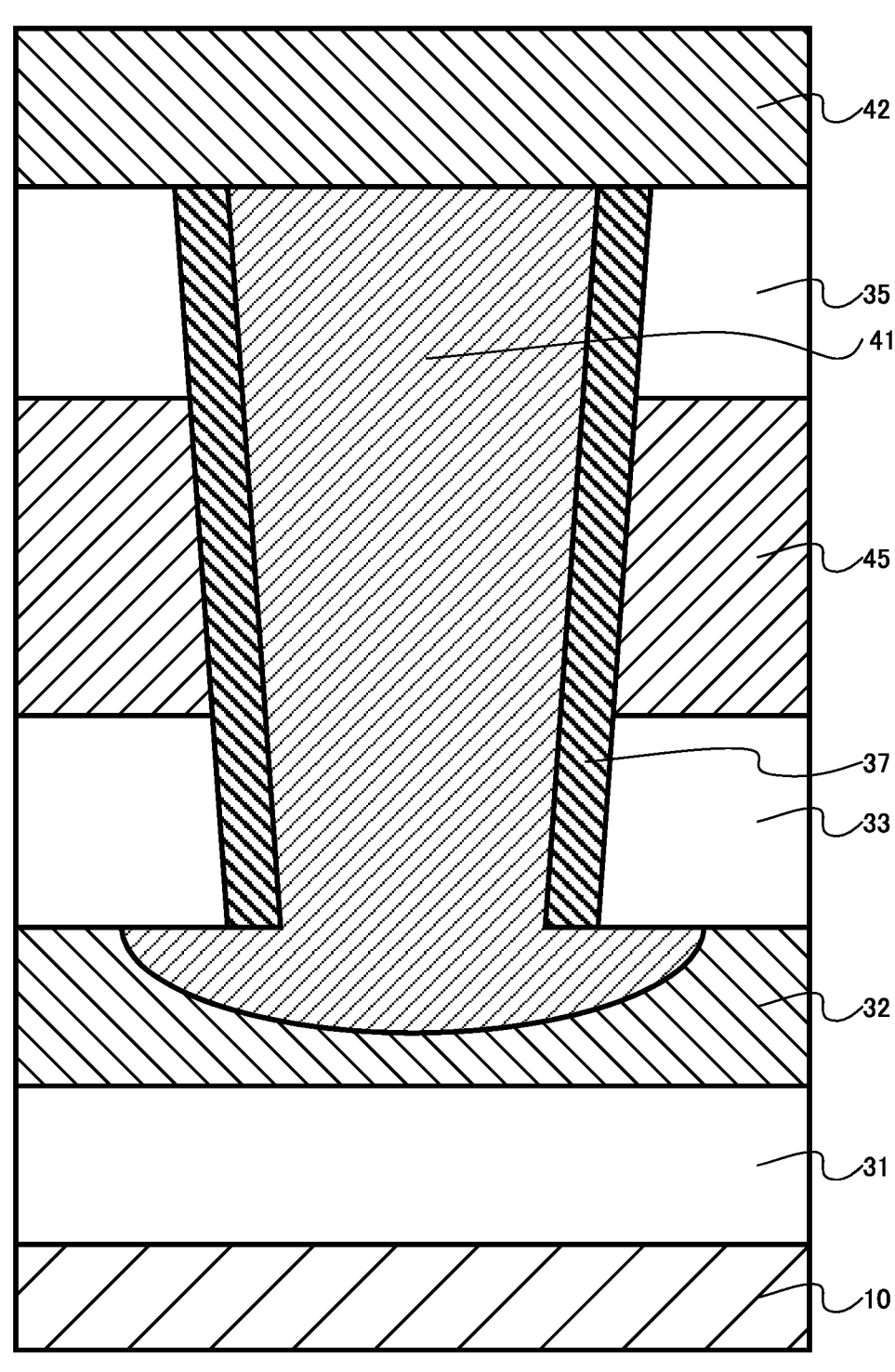
FIG. 18 is a schematic cross-sectional view showing the second example of the semiconductor memory device manufacturing method according to the first embodiment.

Then, a tungsten layer 45 is formed in a region where the silicon nitride layer 44 has been removed (FIG. 18). The tungsten layer 45 is an example of a conductive layer. The tungsten layer 45 is formed by using, for example, a CVD method. The tungsten layer 45 finally becomes the gate electrode 18.

By the manufacturing method described above, the transistor 100 shown in FIGS. 1, 2, and 3 is manufactured.

Next, the function and effect of the semiconductor device according to the first embodiment will be described.

An oxide semiconductor transistor in which a channel is formed in an oxide semiconductor layer has an excellent characteristic that the channel leakage current during off operation is very small. For this reason, for example, it has been considered to apply the oxide semiconductor transistor to a switching transistor of a memory cell of a DRAM.

For example, a vertical oxide semiconductor transistor may have asymmetry in transistor characteristics due to the vertical asymmetry of the transistor structure. For example, the magnitude of the on-current may differ depending on the direction in which the on-current flows.

For example, if the transistor characteristics of the switching transistor of the memory cell of the DRAM become asymmetric, the operating characteristics of the DRAM are degraded. Therefore, it is expected to realize an oxide semiconductor transistor with reduced asymmetry of transistor characteristics.

Figure 19:
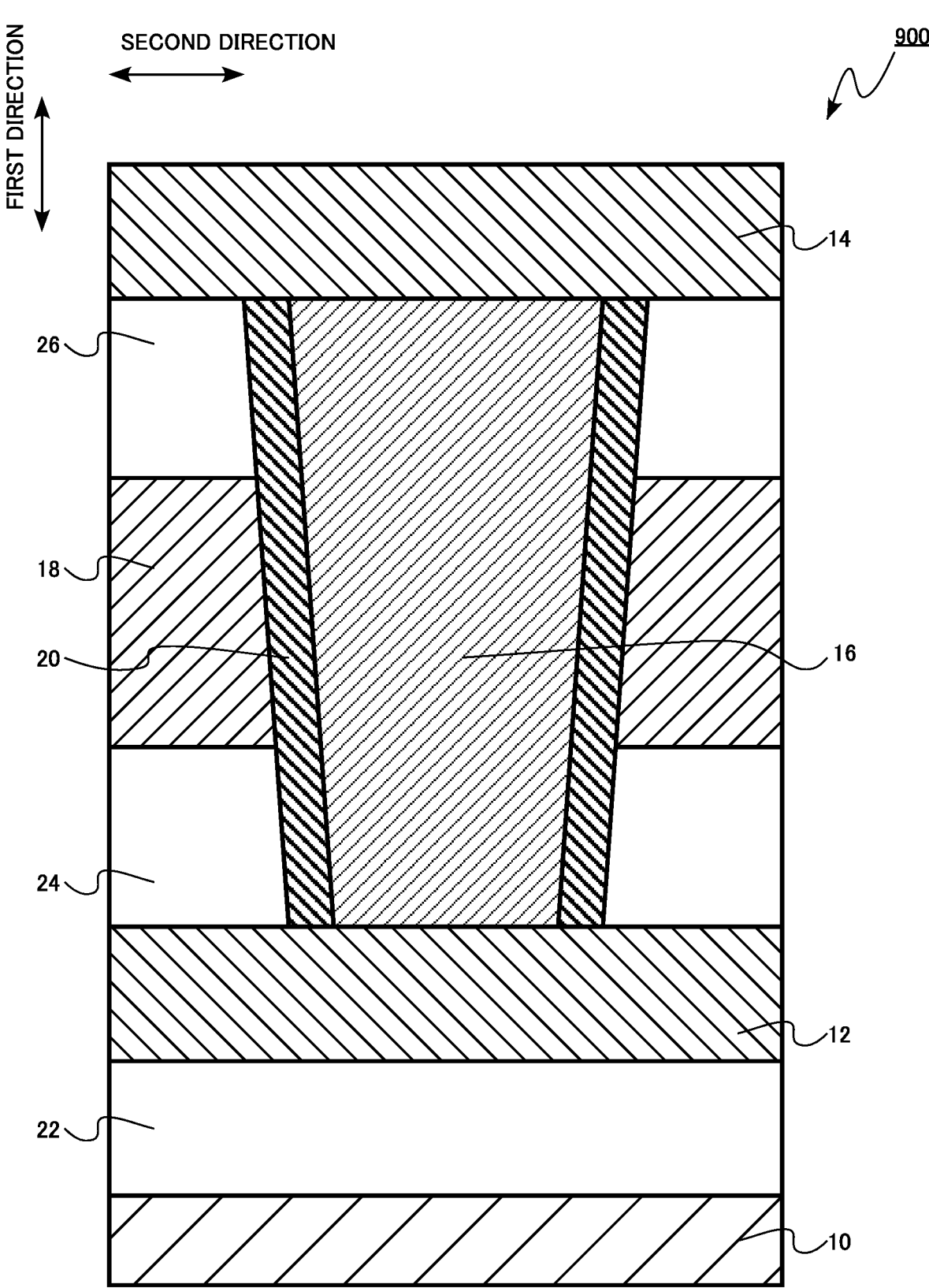
FIG. 19 is a schematic cross-sectional view of a semiconductor device of a comparative example.

FIG. 19 is a schematic cross-sectional view of a semiconductor device of a comparative example. FIG. 19 is a diagram corresponding to FIG. 1 of the semiconductor device according to the first embodiment.

The semiconductor device of the comparative example is a transistor 900. The transistor 900 is an oxide semiconductor transistor. The transistor 900 is different from the transistor 100 according to the first embodiment in that the oxide semiconductor layer 16 does not include the lower region 16a.

In the transistor 900 of the comparative example, the side surface of the oxide semiconductor layer 16 has a forward tapered shape. For this reason, the contact area between the oxide semiconductor layer 16 and the lower electrode 12 is smaller than the contact area between the oxide semiconductor layer 16 and the upper electrode 14. Therefore, for example, when the resistance per unit contact area is equal, the contact resistance between the oxide semiconductor layer 16 and the lower electrode 12 is larger than the contact resistance between the oxide semiconductor layer 16 and the upper electrode 14.

Since the contact resistance between the oxide semiconductor layer 16 and the lower electrode 12 is different from the contact resistance between the oxide semiconductor layer 16 and the upper electrode 14, the asymmetry of the transistor characteristics becomes a problem. For example, the asymmetry of the on-current becomes a problem. The asymmetry of the on-current means that the magnitude of the on-current differs between a case where the current flows from the upper electrode 14 to the lower electrode 12 and a case where the current flows from the lower electrode 12 to the upper electrode 14.

The transistor 100 according to the first embodiment includes the lower region 16a where the oxide semiconductor layer 16 extends in the second direction. For this reason, the contact area between the oxide semiconductor layer 16 and the lower electrode 12 is larger than that in the transistor 900 of the comparative example. Therefore, the difference between the contact resistance between the oxide semiconductor layer 16 and the lower electrode 12 and the contact resistance between the oxide semiconductor layer 16 and the upper electrode 14 is reduced. As a result, the transistor 100 according to the first embodiment has less asymmetry of transistor characteristics than the transistor 900 of the comparative example.

In FIG. 1, from the viewpoint of reducing the difference between the contact resistance between the oxide semiconductor layer 16 and the lower electrode 12 and the contact resistance between the oxide semiconductor layer 16 and the upper electrode 14, it is preferable that the first maximum distance d1 is equal to or more than 1.2 times and equal to or less than twice the minimum distance d2.

In FIG. 1, from the viewpoint of reducing the difference between the contact resistance between the oxide semiconductor layer 16 and the lower electrode 12 and the contact resistance between the oxide semiconductor layer 16 and the upper electrode 14, it is preferable that the first maximum distance d1 is equal to or more than 1.1 times and equal to or less than 1.5 times the second maximum distance d3.

From the viewpoint of reducing the asymmetry of the transistor characteristics, it is preferable that the lower electrode 12 and the upper electrode 14 are formed of the same material.

First Modification Example

Figure 20:
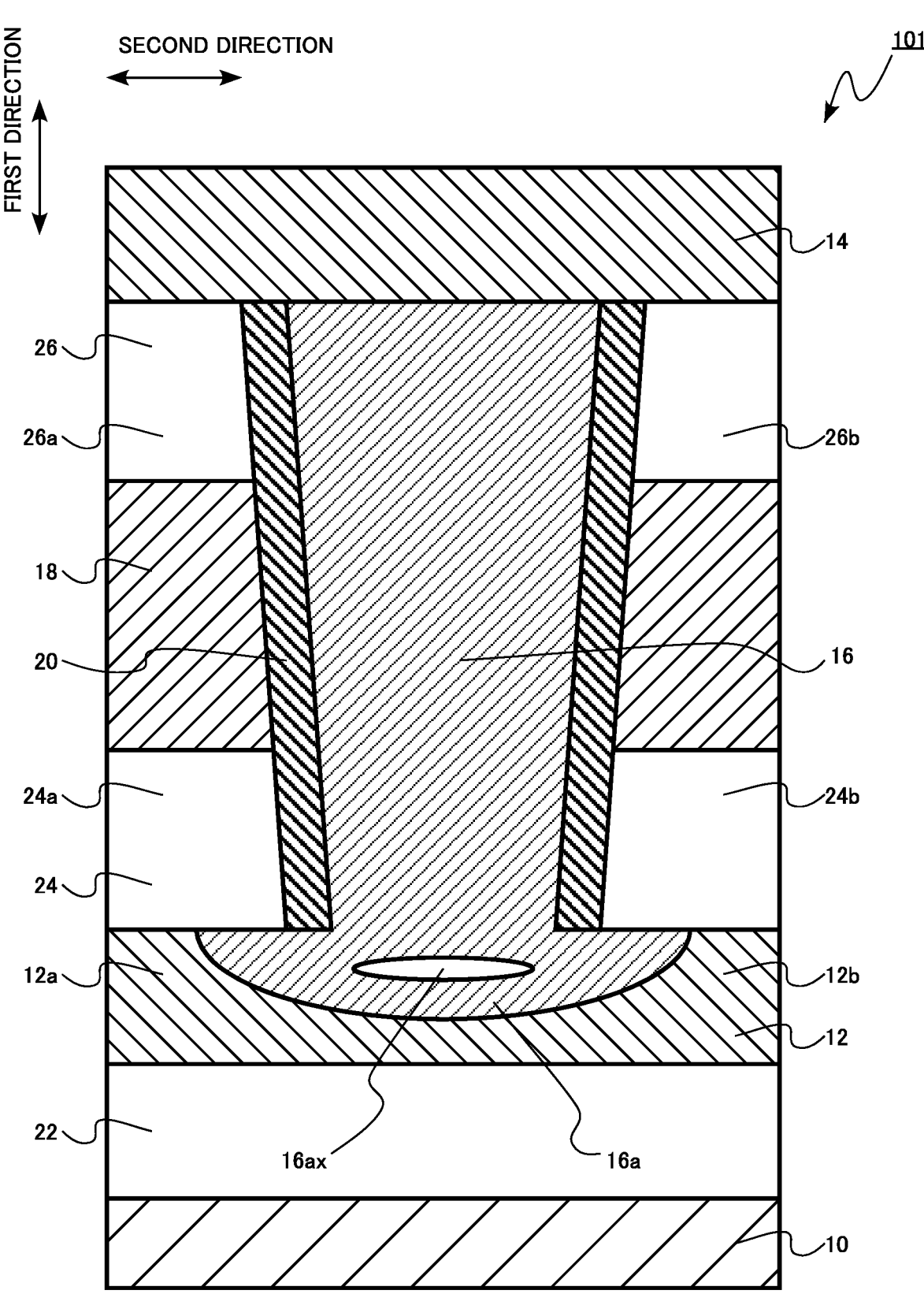
FIG. 20 is a schematic cross-sectional view of a semiconductor device of a first modification example of the first embodiment.

FIG. 20 is a schematic cross-sectional view of a semiconductor device of a first modification example of the first embodiment. FIG. 20 is a diagram corresponding to FIG. 1 of the first embodiment.

A transistor 101 of the first modification example of the first embodiment is different from the transistor 100 according to the first embodiment in that the lower region 16a of the oxide semiconductor layer 16 includes a cavity 16ax.

In the transistor 101, since the lower region 16a includes the cavity 16ax, for example, the stress caused by the thermal expansion or contraction of the lower region 16a is reduced. Therefore, for example, a fluctuation in the contact resistance between the oxide semiconductor layer 16 and the lower electrode 12 is suppressed to improve the reliability of the transistor 101.

In addition, in the transistor 101, since the lower region 16a includes the cavity 16ax, for example, oxygen in the lower region 16a diffuses into the cavity 16ax. Therefore, for example, the oxygen vacancy concentration in the oxide semiconductor layer 16 becomes high, so that the contact resistance between the oxide semiconductor layer 16 and the lower electrode 12 is reduced.

Second Modification Example

Figure 21:
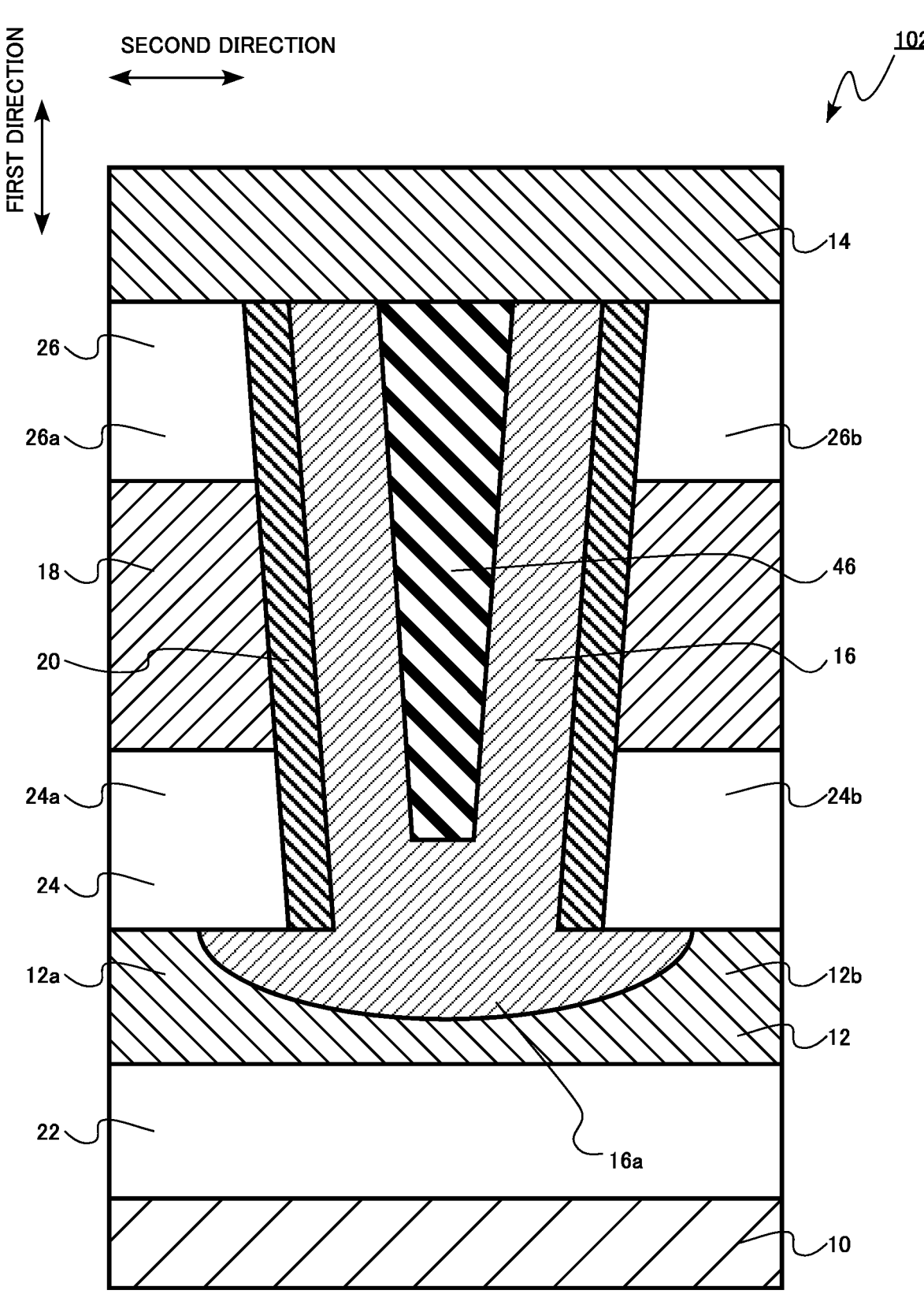
FIG. 21 is a schematic cross-sectional view of a semiconductor device of a second modification example of the first embodiment.

FIG. 21 is a schematic cross-sectional view of a semiconductor device of a second modification example of the first embodiment. FIG. 21 is a diagram corresponding to FIG. 1 of the first embodiment.

A transistor 102 of the second modification example of the first embodiment is different from the transistor 100 according to the first embodiment in that the transistor 102 includes a core insulating layer 46. The core insulating layer 46 is surrounded by the oxide semiconductor layer 16 in a plane perpendicular to the first direction. For example, the core insulating layer 46 is surrounded by the oxide semiconductor layer 16 in a cross section including the gate electrode 18 and perpendicular to the first direction.

The core insulating layer 46 is, for example, an oxide, a nitride, or an oxynitride. The core insulating layer 46 contains, for example, silicon oxide, silicon nitride, or silicon oxynitride. The core insulating layer 46 includes, for example, a silicon oxide layer, a silicon nitride layer, or a silicon oxynitride layer. The core insulating layer 46 is, for example, a silicon oxide layer, a silicon nitride layer, or a silicon oxynitride layer.

As described above, according to the first embodiment and its modification examples, the semiconductor device in which the asymmetry of the transistor characteristics is reduced is realized.

Second Embodiment

A semiconductor device according to a second embodiment is different from the semiconductor device according to the first embodiment in that the thickness of the gate insulating layer between the second insulating layer and the oxide semiconductor layer in the second direction is smaller than the thickness of the gate insulating layer between the first insulating layer and the oxide semiconductor layer in the second direction. Hereinafter, the description of a part of the content overlapping the first embodiment may be omitted.

Figure 22:
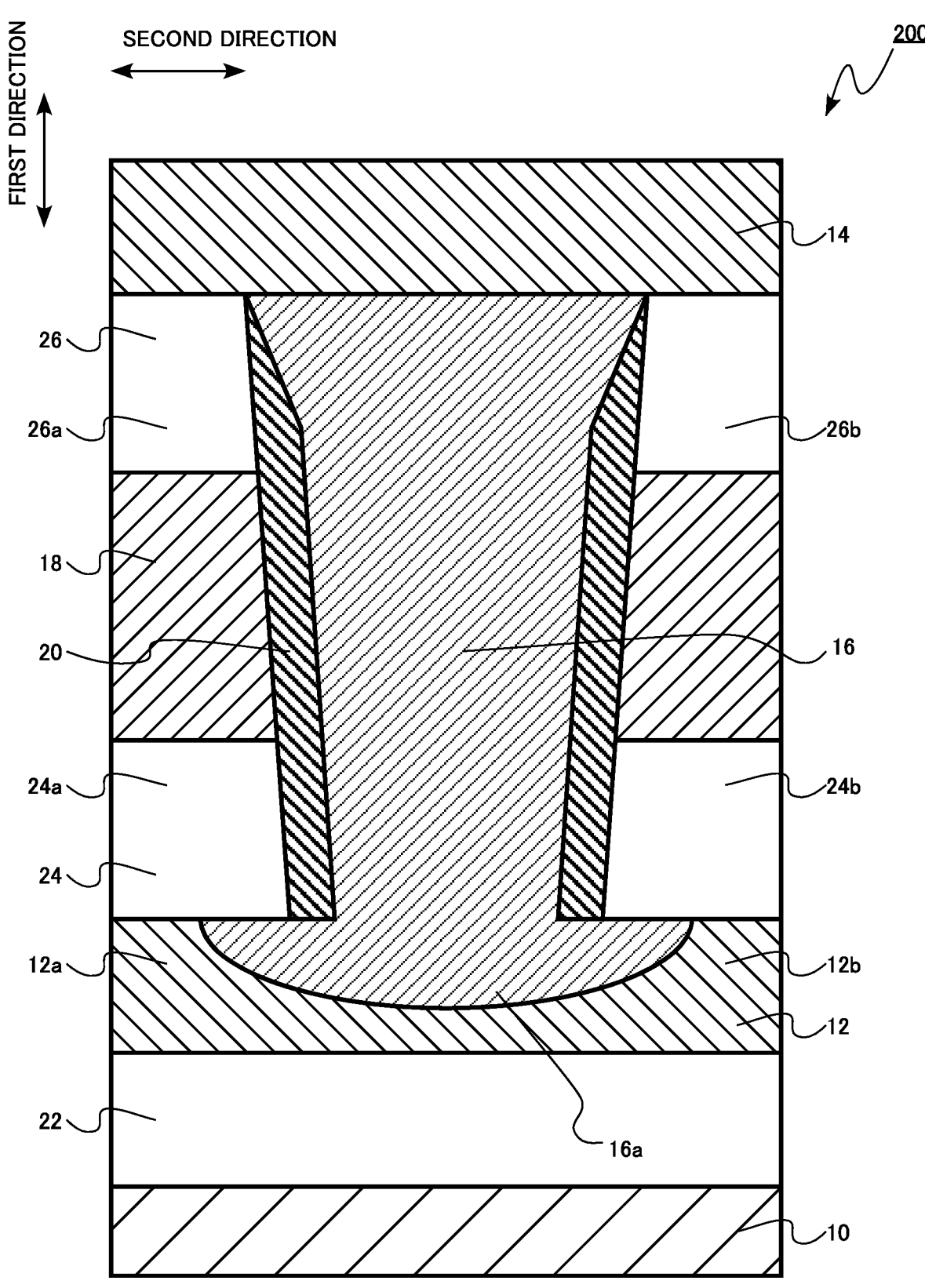
FIG. 22 is a schematic cross-sectional view of a semiconductor device according to a second embodiment.

FIG. 22 is a schematic cross-sectional view of the semiconductor device according to the second embodiment. FIG. 22 is a diagram corresponding to FIG. 1 of the first embodiment.

The semiconductor device according to the second embodiment is a transistor 200. The transistor 200 is an oxide semiconductor transistor. The transistor 200 is a so-called SGT. The transistor 200 is a so-called vertical transistor.

The transistor 200 includes a lower electrode 12, an upper electrode 14, an oxide semiconductor layer 16, a gate electrode 18, a gate insulating layer 20, a lower insulating layer 24, and an upper insulating layer 26. The lower electrode 12 includes a first portion 12a and a second portion 12b. The oxide semiconductor layer 16 includes a lower region 16a. The lower insulating layer 24 includes a third portion 24a and a fourth portion 24b. The upper insulating layer 26 includes a fifth portion 26a and a sixth portion 26b.

The thickness of the gate insulating layer 20 between the upper insulating layer 26 and the oxide semiconductor layer 16 in the second direction is smaller than the thickness of the gate insulating layer 20 between the lower insulating layer 24 and the oxide semiconductor layer 16 in the second direction.

In the transistor 200 according to the second embodiment, the thickness of the gate insulating layer 20 between the upper insulating layer 26 and the oxide semiconductor layer 16 is small. For this reason, the contact area between the oxide semiconductor layer 16 and the upper electrode 14 is larger than that in the transistor 100 according to the first embodiment, for example. Therefore, since the contact resistance between the oxide semiconductor layer 16 and the upper electrode 14 is reduced, the on-resistance of the transistor 200 is reduced.

Modification Example

Figure 23:
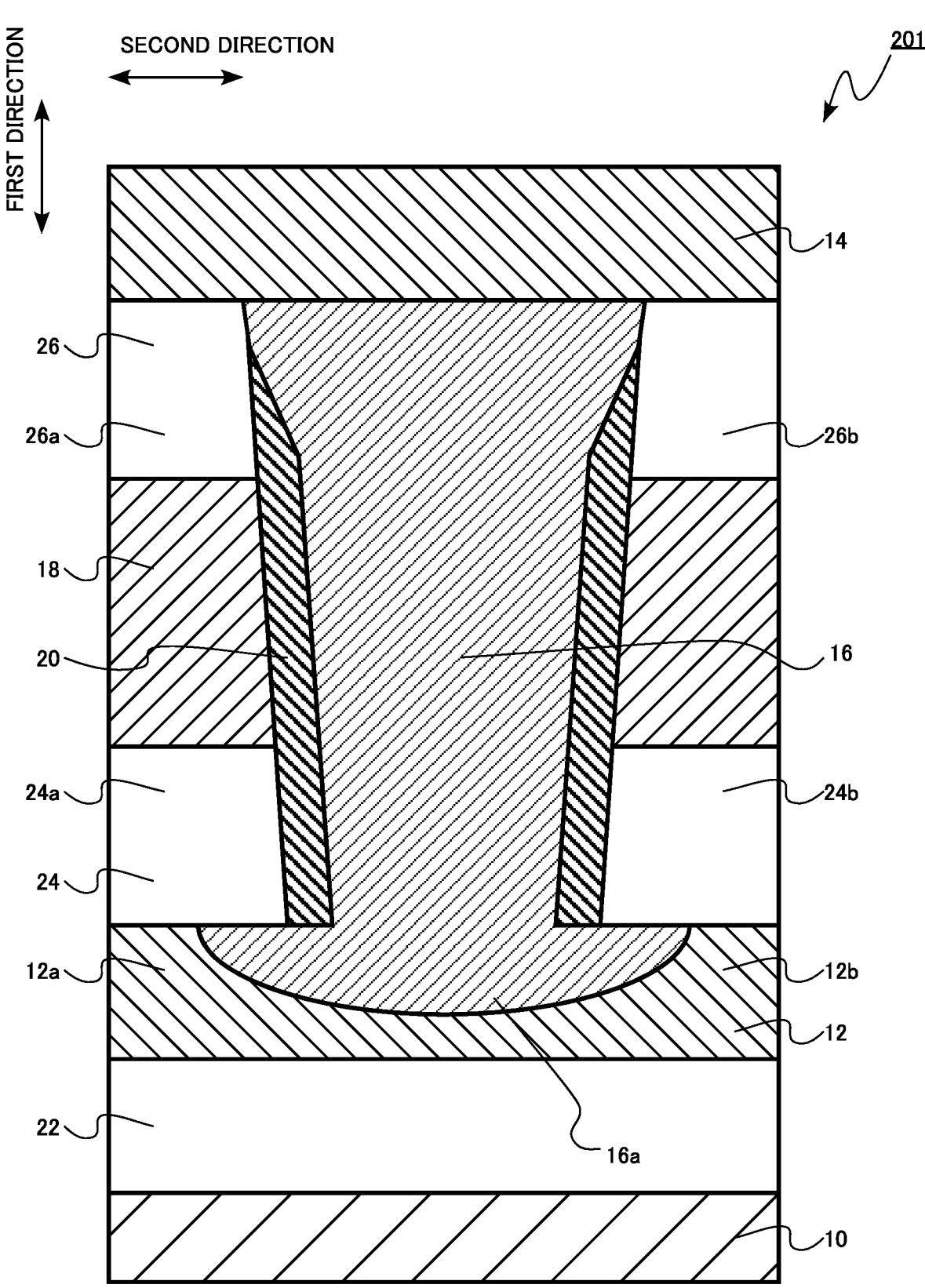
FIG. 23 is a schematic cross-sectional view of a semiconductor device of a modification example of the second embodiment.

FIG. 23 is a schematic cross-sectional view of a semiconductor device of a modification example of the second embodiment. FIG. 23 is a diagram corresponding to FIG. 22 of the second embodiment.

A transistor 201 of the modification example of the second embodiment is different from the transistor 200 according to the second embodiment in that at least a part of the upper insulating layer 26 is in contact with the oxide semiconductor layer 16.

As described above, according to the second embodiment and its modification example, the semiconductor device in which the asymmetry of the transistor characteristics is reduced is realized.

Third Embodiment

A semiconductor device according to a third embodiment is different from the semiconductor device according to the first embodiment in that, in the cross section of the oxide semiconductor layer parallel to the first direction, the first width in the second direction perpendicular to the first direction at the first position in the oxide semiconductor layer is equal to the second width in the second direction at the second position closer to the second electrode than the first position in the oxide semiconductor layer. Hereinafter, the description of a part of the content overlapping the first embodiment may be omitted.

Figure 24:
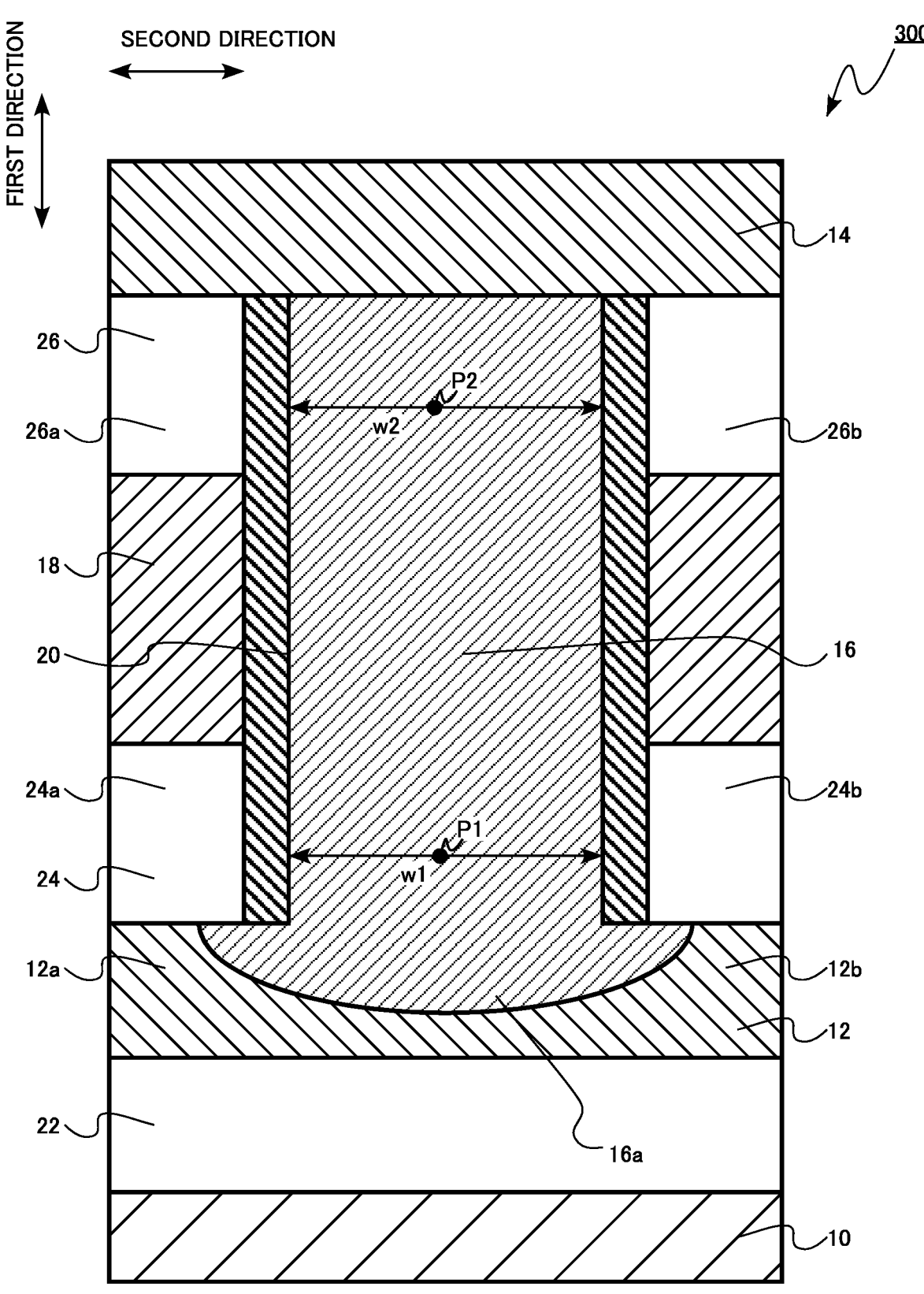
FIG. 24 is a schematic cross-sectional view of a semiconductor device according to a third embodiment.

FIG. 24 is a schematic cross-sectional view of the semiconductor device according to the third embodiment. FIG. 24 is a diagram corresponding to FIG. 1 of the first embodiment.

The semiconductor device according to the third embodiment is a transistor 300. The transistor 300 is an oxide semiconductor transistor. The transistor 300 is a so-called SGT. The transistor 300 is a so-called vertical transistor.

The transistor 300 includes a lower electrode 12, an upper electrode 14, an oxide semiconductor layer 16, a gate electrode 18, a gate insulating layer 20, a lower insulating layer 24, and an upper insulating layer 26. The lower electrode 12 includes a first portion 12a and a second portion 12b. The oxide semiconductor layer 16 includes a lower region 16a. The lower insulating layer 24 includes a third portion 24a and a fourth portion 24b. The upper insulating layer 26 includes a fifth portion 26a and a sixth portion 26b.

In the cross section of the oxide semiconductor layer 16 parallel to the first direction, the first width (w1 in FIG. 24) of the oxide semiconductor layer 16 in the second direction perpendicular to the first direction at a first position (P1 in FIG. 24) in the oxide semiconductor layer 16 is equal to the second width (w2 in FIG. 24) of the oxide semiconductor layer 16 in the second direction at a second position (P2 in FIG. 24) closer to the upper electrode 14 than the first position P1 in the oxide semiconductor layer 16.

The width of the oxide semiconductor layer 16 in the second direction is the same from the upper electrode 14 to the lower electrode 12, for example. The side surface of the oxide semiconductor layer 16 does not have a tapered shape.

For example, a case is considered in which the resistance per unit contact area between the oxide semiconductor layer 16 and the lower electrode 12 is larger than the resistance per unit contact area between the oxide semiconductor layer 16 and the upper electrode 14. For example, when the materials of the lower electrode 12 and the upper electrode 14 are different, a case is considered in which the resistance per unit contact area between the oxide semiconductor layer 16 and the lower electrode 12 is larger than the resistance per unit contact area between the oxide semiconductor layer 16 and the upper electrode 14. In this case, if the contact area between the oxide semiconductor layer 16 and the lower electrode 12 is equal to the contact area between the oxide semiconductor layer 16 and the upper electrode 14, the contact resistance between the oxide semiconductor layer 16 and the lower electrode 12 is larger than the contact resistance between the oxide semiconductor layer 16 and the upper electrode 14.

According to the transistor 300 of the third embodiment, the oxide semiconductor layer 16 includes the lower region 16a extending in the second direction. For this reason, the contact area between the oxide semiconductor layer 16 and the lower electrode 12 is larger than the contact area between the oxide semiconductor layer 16 and the upper electrode 14.

Therefore, the difference between the contact resistance between the oxide semiconductor layer 16 and the lower electrode 12 and the contact resistance between the oxide semiconductor layer 16 and the upper electrode 14 is reduced. As a result, in the transistor 300 according to the third embodiment, the asymmetry of the transistor characteristics is reduced.

As described above, according to the third embodiment, the semiconductor device in which the asymmetry of the transistor characteristics is reduced is realized.

Fourth Embodiment

A semiconductor memory device according to a fourth embodiment includes: a first electrode; a second electrode; an oxide semiconductor layer provided between the first electrode and the second electrode and including a first region surrounded by the first electrode in a plane perpendicular to a first direction from the first electrode toward the second electrode; a gate electrode facing the oxide semiconductor layer in the first direction; a gate insulating layer provided between the oxide semiconductor layer and the gate electrode; a first insulating layer provided between the gate electrode and the first electrode; a second insulating layer provided between the gate electrode and the second electrode; and a capacitor electrically connected to the first electrode or the second electrode. Then, in a cross section parallel to the first direction, the first electrode includes a first portion and a second portion, and the first region is provided between the first portion and the second portion in a second direction perpendicular to the first direction. In addition, in the cross section, the first insulating layer includes a third portion and a fourth portion, and the oxide semiconductor layer is provided between the third portion and the fourth portion in the second direction. A first maximum distance between the first portion and the second portion in the second direction is larger than a minimum distance between the third portion and the fourth portion in the second direction.

The semiconductor memory device according to the fourth embodiment is a semiconductor memory 400. The semiconductor memory device according to the fourth embodiment is a DRAM. In the semiconductor memory 400, the transistor 100 according to the first embodiment is used as a switching transistor of a memory cell of a DRAM.

Hereinafter, the description of a part of the content overlapping the first embodiment will be omitted.

Figure 25:
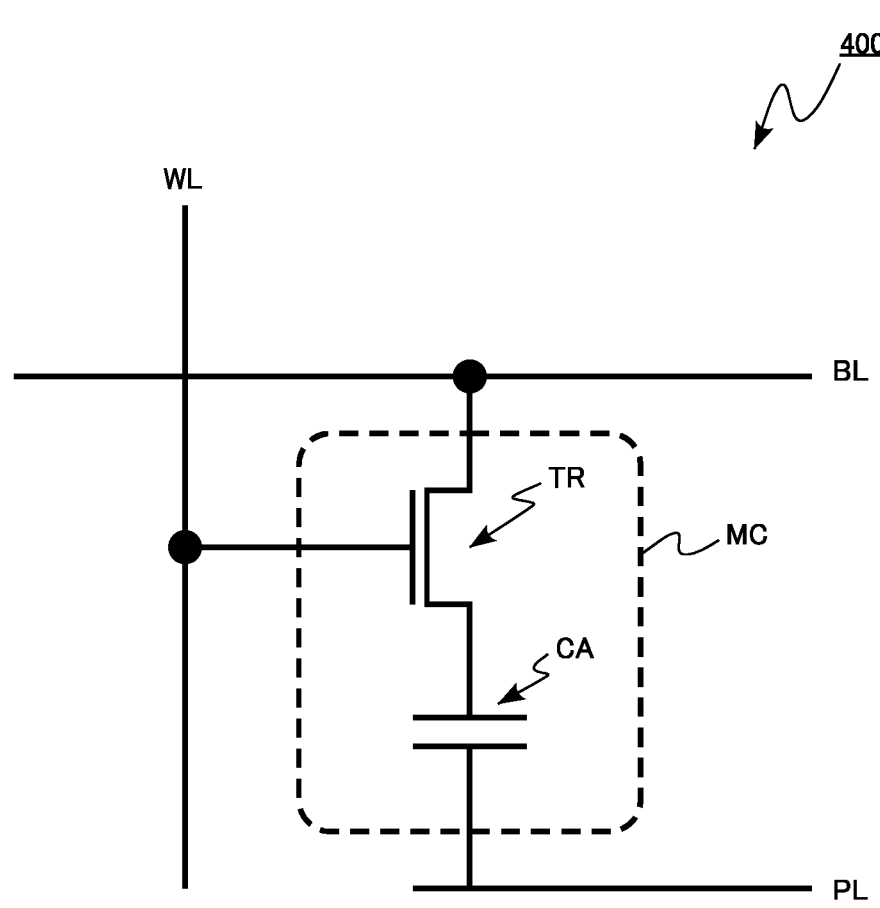
FIG. 25 is an equivalent circuit diagram of a semiconductor memory device according to a fourth embodiment.

FIG. 25 is an equivalent circuit diagram of the semiconductor memory device according to the fourth embodiment. FIG. 25 illustrates a case where one memory cell MC is provided. However, for example, a plurality of memory cells MC may be provided in an array.

The semiconductor memory 400 includes the memory cell MC, a word line WL, a bit line BL, and a plate line PL. The memory cell MC includes a switching transistor TR and a capacitor CA. In FIG. 25, the area surrounded by the broken line is the memory cell MC.

The word line WL is electrically connected to the gate electrode of the switching transistor TR. The bit line BL is electrically connected to one of the source electrode and the drain electrode of the switching transistor TR. One electrode of the capacitor CA is electrically connected to the other one of the source electrode and the drain electrode of the switching transistor TR. The other electrode of the capacitor CA is connected to the plate line PL.

The memory cell MC stores data by storing charges in the capacitor CA. Data is written and read by turning on the switching transistor TR.

For example, data is written to the memory cell MC by turning on the switching transistor TR in a state in which a desired voltage is applied to the bit line BL.

In addition, for example, a voltage change in the bit line BL according to the amount of charge stored in the capacitor is detected by turning on the switching transistor TR, thereby reading the data of the memory cell MC.

Figure 26:
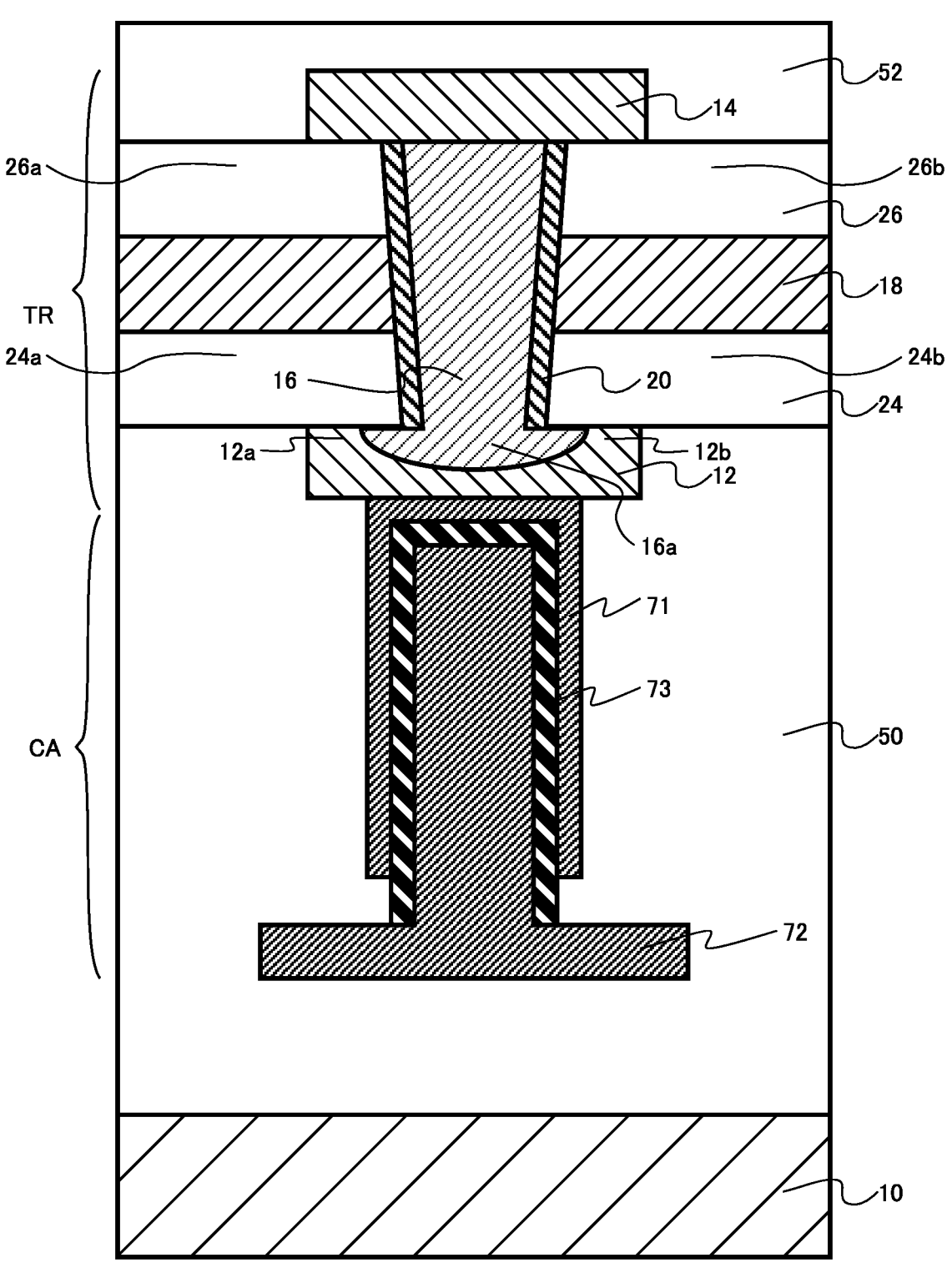
FIG. 26 is a schematic cross-sectional view of the semiconductor memory device according to the fourth embodiment.

FIG. 26 is a schematic cross-sectional view of the semiconductor memory device according to the fourth embodiment. FIG. 26 shows a cross section of the memory cell MC of the semiconductor memory 400.

The semiconductor memory 400 includes a silicon substrate 10, a switching transistor TR, a capacitor CA, a lower interlayer insulating layer 50, and an upper interlayer insulating layer 52.

The switching transistor TR includes a lower electrode 12, an upper electrode 14, an oxide semiconductor layer 16, a gate electrode 18, a gate insulating layer 20, a lower insulating layer 24, and an upper insulating layer 26. The lower electrode 12 includes a first portion 12a and a second portion 12b. The oxide semiconductor layer 16 includes a lower region 16a. The lower insulating layer 24 includes a third portion 24a and a fourth portion 24b. The upper insulating layer 26 includes a fifth portion 26a and a sixth portion 26b.

The lower electrode 12 is an example of the first electrode. The upper electrode 14 is an example of the second electrode. The lower insulating layer 24 is an example of the first insulating layer. The upper insulating layer 26 is an example of the second insulating layer. The lower region 16a is an example of the first region.

The switching transistor TR has a structure similar to that of the transistor 100 according to the first embodiment.

The capacitor CA is provided between the silicon substrate 10 and the switching transistor TR. The capacitor CA is provided between the silicon substrate 10 and the lower electrode 12. The capacitor CA is electrically connected to the lower electrode 12.

The capacitor CA includes a cell electrode 71, a plate electrode 72, and a capacitor insulating film 73. The cell electrode 71 is electrically connected to the lower electrode 12. The cell electrode 71 is in contact with, for example, the lower electrode 12.

The cell electrode 71 and the plate electrode 72 are, for example, titanium nitride. The capacitor insulating film 73 has, for example, a stacked structure of zirconium oxide, aluminum oxide, and zirconium oxide.

The gate electrode 18 is electrically connected to, for example, the word line WL (not shown). The upper electrode 14 is electrically connected to, for example, the bit line BL (not shown). The plate electrode 72 is connected to, for example, the plate line PL (not shown).

In the semiconductor memory 400, an oxide semiconductor transistor having a very small channel leakage current during off operation is applied as the switching transistor TR. Therefore, a DRAM having an excellent charge storage characteristic is realized.

In addition, in the switching transistor TR of the semiconductor memory 400, the asymmetry of the transistor characteristics is reduced. Therefore, the operating characteristics of the semiconductor memory 400 are improved.

In the first to third embodiments, a transistor in which the gate electrode 18 is provided so as to surround the oxide semiconductor layer 16 has been described as an example. However, the transistor of embodiments may be a transistor in which a gate electrode does not surround an oxide semiconductor layer. For example, the transistor of embodiments may be a transistor in which an oxide semiconductor layer is interposed between two gate electrodes.

In the manufacturing method according to the first embodiment, the case where the amorphous silicon film 38 is formed as a protective film inside the opening 36 has been described as an example. However, the formation of the protective film can be omitted.

In the manufacturing method according to the first embodiment, the case where the recess 40 is formed inside the opening 36 after the fourth silicon oxide film 37 is formed has been described as an example. However, the recess 40 can be formed before the fourth silicon oxide film 37 is formed.

In the fourth embodiment, a semiconductor memory to which the transistor according to the first embodiment is applied has been described as an example. However, the semiconductor memory of embodiments may be a semiconductor memory to which the transistor according to the second embodiment or the third embodiment is applied.

In the fourth embodiment, a semiconductor memory in which a cell electrode is electrically connected to the lower electrode 12 has been described as an example. However, the semiconductor memory of embodiments may be a semiconductor memory in which a cell electrode is electrically connected to the upper electrode 14.

While certain embodiments have been described, these embodiments have been presented by way of example only, and are not intended to limit the scope of the inventions. Indeed, the semiconductor device, the semiconductor memory device, and the semiconductor device manufacturing method described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first electrode;
   a second electrode;
   an oxide semiconductor layer provided between the first electrode and the second electrode and including a first region surrounded by the first electrode in a plane perpendicular to a first direction from the first electrode toward the second electrode;
   a gate electrode facing the oxide semiconductor layer;
   a gate insulating layer provided between the oxide semiconductor layer and the gate electrode;
   a first insulating layer provided between the gate electrode and the first electrode; and
   a second insulating layer provided between the gate electrode and the second electrode,
   wherein, in a cross section parallel to the first direction, the first electrode includes a first portion and a second portion, and the first region is provided between the first portion and the second portion in a second direction perpendicular to the first direction,
   in the cross section, the first insulating layer includes a third portion and a fourth portion, and the oxide semiconductor layer is provided between the third portion and the fourth portion in the second direction,
   a first maximum distance between the first portion and the second portion in the second direction is larger than a minimum distance between the third portion and the fourth portion in the second direction, and the first region of the oxide semiconductor layer includes at least one portion provided between the gate insulating layer and the first electrode in the first direction, the at least one portion is provided between the third portion of the first insulating layer and the first electrode in the first direction, and the least one portion is in direct contact with the third portion of the first insulating layer in the first direction.

2. The semiconductor device according to claim 1, wherein the first maximum distance is equal to or more than 1.2 times the minimum distance.

3. The semiconductor device according to claim 1, wherein, in the cross section, the second insulating layer includes a fifth portion and a sixth portion, the oxide semiconductor layer is provided between the fifth portion and the sixth portion in the second direction, and a second maximum distance between the fifth portion and the sixth portion in the second direction is smaller than the first maximum distance.

4. The semiconductor device according to claim 1, wherein the gate electrode surrounds the oxide semiconductor layer.

5. The semiconductor device according to claim 1, wherein, in the cross section of the oxide semiconductor layer, a first width in the second direction at a first position in the oxide semiconductor layer is smaller than a second width in the second direction at a second position closer to the second electrode than the first position in the oxide semiconductor layer.

6. The semiconductor device according to claim 1, wherein the first region includes a cavity.

7. The semiconductor device according to claim 1, wherein the first electrode and the second electrode contain a same material.

8. The semiconductor device according to claim 1, wherein the first electrode contains indium (In), tin (Sn), and oxygen (O).

9. The semiconductor device according to claim 1, wherein a thickness of the gate insulating layer between the second insulating layer and the oxide semiconductor layer in the second direction is smaller than a thickness of the gate insulating layer between the first insulating layer and the oxide semiconductor layer in the second direction.

10. The semiconductor device according to claim 9, wherein the second insulating layer is in contact with the oxide semiconductor layer.

11. A semiconductor memory device, comprising:
a first electrode;
a second electrode;
an oxide semiconductor layer provided between the first electrode and the second electrode and including a first region surrounded by the first electrode in a plane perpendicular to a first direction from the first electrode toward the second electrode;
a gate electrode facing the oxide semiconductor layer;
a gate insulating layer provided between the oxide semiconductor layer and the gate electrode;
a first insulating layer provided between the gate electrode and the first electrode;
a second insulating layer provided between the gate electrode and the second electrode; and
a capacitor electrically connected to the first electrode or the second electrode, wherein, in a cross section parallel to the first direction, the first electrode includes a first portion and a second portion, and the first region is provided between the first portion and the second portion in a second direction perpendicular to the first direction, in the cross section, the first insulating layer includes a third portion and a fourth portion, and the oxide semiconductor layer is provided between the third portion and the fourth portion in the second direction, a first maximum distance between the first portion and the second portion in the second direction is larger than a minimum distance between the third portion and the fourth portion in the second direction, and the first region of the oxide semiconductor layer includes at least one portion provided between the gate insulating layer and the first electrode in the first direction, the at least one portion is provided between the third portion of the first insulating layer and the first electrode in the first direction, and the least one portion is in direct contact with the third portion of the first insulating layer in the first direction.

12. The semiconductor memory device according to claim 11, wherein the first maximum distance is equal to or more than 1.2 times the minimum distance.

13. The semiconductor memory device according to claim 11, wherein, in the cross section, the second insulating layer includes a fifth portion and a sixth portion, the oxide semiconductor layer is provided between the fifth portion and the sixth portion in the second direction, and a second maximum distance between the fifth portion and the sixth portion in the second direction is smaller than the first maximum distance.

14. The semiconductor memory device according to claim 11, wherein the gate electrode surrounds the oxide semiconductor layer.

15. The semiconductor memory device according to claim 11, wherein, in the cross section of the oxide semiconductor layer, a first width in the second direction at a first position in the oxide semiconductor layer is smaller than a second width in the second direction at a second position closer to the second electrode than the first position in the oxide semiconductor layer.

16. The semiconductor memory device according to claim 11, wherein the first region includes a cavity.

17. The semiconductor memory device according to claim 11, wherein the first electrode and the second electrode contain a same material.

18. The semiconductor memory device according to claim 11, wherein the first electrode contains indium (In), tin (Sn), and oxygen (O).

19. The semiconductor memory device according to claim 11, wherein a thickness of the gate insulating layer between the second insulating layer and the oxide semiconductor layer in the second direction is smaller than a thickness of the gate insulating layer between the first insulating layer and the oxide semiconductor layer in the second direction.

20. The semiconductor memory device according to claim 19, wherein the second insulating layer is in contact with the oxide semiconductor layer.

* * * * *